(12) United States Patent
Cho et al.

(10) Patent No.: US 10,319,841 B2
(45) Date of Patent: Jun. 11, 2019

(54) INTEGRATED CIRCUIT DEVICE INCLUDING ASYMMETRICAL FIN FIELD-EFFECT TRANSISTOR

(71) Applicant: Samsung Electronics Co., Ltd., Suwon-si (KR)

(72) Inventors: Edward Namkyu Cho, Seongnam-si (KR); Bo-ra Lim, Seoul (KR); Geum-jung Seong, Seoul (KR); Seung-hun Lee, Hwaseong-si (KR)

(73) Assignee: SAMSUNG ELECTRONICS CO., LTD., Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 15/870,549

(22) Filed: Jan. 12, 2018

(65) Prior Publication Data
US 2019/0067455 A1    Feb. 28, 2019

(30) Foreign Application Priority Data
Aug. 22, 2017   (KR) ........................ 10-2017-0106255

(51) Int. Cl.
*H01L 29/66* (2006.01)
*H01L 21/8234* (2006.01)
(Continued)

(52) U.S. Cl.
CPC .. *H01L 29/66795* (2013.01); *H01L 21/02532* (2013.01); *H01L 21/02576* (2013.01);
(Continued)

(58) Field of Classification Search
CPC ......... H01L 29/66795; H01L 21/02576; H01L 21/02639; H01L 21/02634;
(Continued)

(56) References Cited

U.S. PATENT DOCUMENTS 7,425,500 B2   9/2008  Metz et al.
7,554,165 B2   6/2009  Hokazono
(Continued)

FOREIGN PATENT DOCUMENTS

CN   104078355 A   10/2014
JP   2014-063929 A   4/2014
(Continued)

*Primary Examiner* — Fernando L Toledo
*Assistant Examiner* — Adam S Bowen
(74) *Attorney, Agent, or Firm* — Muir Patent Law, PLLC

(57) ABSTRACT

An integrated circuit device includes: a first fin active region extending in a first direction parallel to a top surface of a substrate; a second fin active region extending in the first direction and spaced apart from the first fin active region in a second direction different from the first direction; a gate line intersecting the first and second fin active regions; a first source/drain region on one side of the gate line in the first fin active region; and a second source/drain region on one side of the gate line in the second fin active region and facing the first source/drain region, wherein a cross-section of the first source/drain region perpendicular to the first direction has an asymmetric shape with respect to a center line of the first source/drain region in the second direction extending in a third direction perpendicular to the top surface of the substrate.

20 Claims, 20 Drawing Sheets

(51) Int. Cl.
   *H01L 21/8238* (2006.01)
   *H01L 21/308* (2006.01)
   *H01L 21/02* (2006.01)
   *H01L 29/78* (2006.01)
   *H01L 29/08* (2006.01)

(52) U.S. Cl.
   CPC .. *H01L 21/02579* (2013.01); *H01L 21/02598* (2013.01); *H01L 21/02634* (2013.01); *H01L 21/02639* (2013.01); *H01L 21/3083* (2013.01); *H01L 21/823418* (2013.01); *H01L 21/823431* (2013.01); *H01L 21/823821* (2013.01); *H01L 29/0847* (2013.01); *H01L 29/78* (2013.01)

(58) Field of Classification Search
   CPC ......... H01L 21/02598; H01L 21/02579; H01L 29/0847; H01L 21/02532; H01L 21/3083; H01L 21/823821; H01L 21/823431; H01L 21/823418; H01L 29/78
   USPC ........................................................ 257/401
   See application file for complete search history.

(56) References Cited

U.S. PATENT DOCUMENTS

| | | | |
|---|---|---|---|
| 7,692,254 B2 | 4/2010 | Anderson et al. | |
| 7,898,041 B2 | 3/2011 | Radosavljevic et al. | |
| 7,910,994 B2 | 3/2011 | Yu et al. | |
| 7,915,693 B2 | 3/2011 | Okano | |
| 8,043,920 B2 | 10/2011 | Chan et al. | |
| 8,116,121 B2 | 2/2012 | Kawasaki | |
| 8,207,040 B2 | 6/2012 | Chung et al. | |
| 8,211,761 B2 | 7/2012 | Tan et al. | |
| 8,263,451 B2 | 9/2012 | Su et al. | |
| 8,460,990 B2 | 6/2013 | Kim et al. | |
| 8,623,728 B2 | 1/2014 | Chang et al. | |
| 8,703,556 B2 | 4/2014 | Kelly et al. | |
| 8,759,184 B2 | 6/2014 | Ho et al. | |
| 8,796,093 B1 | 8/2014 | Cheng et al. | |
| 8,946,029 B2 | 2/2015 | Wong et al. | |
| 9,029,930 B2 | 5/2015 | Kelly et al. | |
| 9,236,452 B2 | 1/2016 | Lim et al. | |
| 9,293,459 B1 | 3/2016 | Cheng et al. | |
| 9,318,578 B2 | 4/2016 | Basker et al. | |
| 9,466,724 B2 | 10/2016 | Yang et al. | |
| 9,472,470 B2 | 10/2016 | Cheng et al. | |
| 9,472,669 B1 | 10/2016 | Chiang et al. | |
| 9,490,258 B2 | 11/2016 | Jeong et al. | |
| 9,530,661 B2 | 12/2016 | Kim et al. | |
| 9,595,611 B2 | 3/2017 | Kim et al. | |
| 9,601,575 B2 | 3/2017 | Jung et al. | |
| 9,640,533 B2 | 5/2017 | Lim et al. | |
| 9,991,257 B2 | 6/2018 | Park et al. | |
| 2006/0216880 A1 | 9/2006 | Suto | |
| 2007/0148837 A1 | 6/2007 | Shah et al. | |
| 2008/0111197 A1 | 5/2008 | Mikasa | |
| 2011/0073952 A1 | 3/2011 | Kwok et al. | |
| 2011/0079855 A1 | 4/2011 | Chan et al. | |
| 2011/0298058 A1 | 12/2011 | Kawasaki et al. | |
| 2013/0341631 A1 | 12/2013 | Maeda et al. | |
| 2014/0001520 A1 | 1/2014 | Glass et al. | |
| 2014/0061734 A1 | 3/2014 | Basker et al. | |
| 2014/0065782 A1 | 3/2014 | Lu et al. | |
| 2014/0131776 A1 | 5/2014 | Ching et al. | |
| 2014/0183605 A1 | 7/2014 | Mochizuki et al. | |
| 2014/0197458 A1 | 7/2014 | Ching et al. | |
| 2014/0264279 A1 | 9/2014 | Cheng et al. | |
| 2014/0264440 A1 | 9/2014 | Chen et al. | |
| 2014/0319581 A1 | 10/2014 | Sung et al. | |
| 2015/0214369 A1 | 7/2015 | Fronheiser et al. | |
| 2015/0303118 A1 | 10/2015 | Wang et al. | |
| 2016/0133632 A1* | 5/2016 | Park | H01L 21/823828 257/369 |
| 2016/0315172 A1 | 10/2016 | Wu et al. | |
| 2017/0054003 A1 | 2/2017 | Liao et al. | |

FOREIGN PATENT DOCUMENTS

| | | |
|---|---|---|
| KR | 10-2008-0068997 A | 7/2008 |
| KR | 10-2014-0029094 A | 3/2014 |

\* cited by examiner

INTEGRATED CIRCUIT DEVICE INCLUDING ASYMMETRICAL FIN FIELD-EFFECT TRANSISTOR

CROSS-REFERENCE TO RELATED APPLICATION

This application claims the benefit of Korean Patent Application No. 10-2017-0106255, filed on Aug. 22, 2017, in the Korean Intellectual Property Office, the disclosure of which is incorporated herein in its entirety by reference.

BACKGROUND

The present disclosure relates to an integrated circuit device, and more particularly, to an integrated circuit device including a fin active region.

There is a growing demand for high integration of integrated circuit devices according to a tendency of electronic products to be thinner and smaller. Down-scaling of integrated circuit devices may cause a short channel effect of transistors, which reduces the reliability of integrated circuit devices. In order to reduce the short channel effect, an integrated circuit device including a fin active region has been proposed. In addition, as the design rule decreases, sizes of components of the integrated circuit device and distance therebetween are also reduced.

SUMMARY

The present disclosure provides an integrated circuit device in which electrical shorts between adjacent source/drain regions may be prevented even when a distance between adjacent source/drain regions is reduced.

According to an aspect of the inventive concept, there is provided an integrated circuit device including: a first fin active region protruding from a substrate and extending in a first direction parallel to a top surface of the substrate; a second fin active region protruding from the substrate, the second fin active region extending in the first direction and spaced apart from the first fin active region in a second direction different from the first direction; a gate line intersecting the first and second fin active regions on the substrate and extending in the second direction; a first source/drain region on one side of the gate line in the first fin active region; and a second source/drain region on one side of the gate line in the second fin active region and facing the first source/drain region, wherein a cross-section of the first source/drain region perpendicular to the first direction has an asymmetric shape with respect to a center line of the first source/drain region in the second direction extending in a third direction perpendicular to the top surface of the substrate.

According to another aspect of the inventive concept, there is provided an integrated circuit device including: a first fin active region protruding from a substrate and extending in a first direction parallel to a top surface of the substrate; a second fin active region protruding from the substrate, the second fin active region extending in the first direction and spaced apart from the first fin active region in a second direction different from the first direction; a gate line intersecting the first and second fin active regions on the substrate and extending in the second direction; a first source/drain region on one side of the gate line in the first fin active region; and a second source/drain region on one side of the gate line in the second fin active region and facing the first source/drain region, wherein the first source/drain region comprises a first sidewall facing the second source/drain region and a second sidewall opposite to the first sidewall, and the first sidewall of the first source/drain region has a profile different from the second sidewall with respect to a centerline of the first source/drain region in the second direction extending in a third direction perpendicular to the top surface of the substrate.

According to another aspect of the inventive concept, there is provided an integrated circuit device including: a first fin active region protruding from a substrate and extending in a first direction parallel to a top surface of the substrate; a second fin active region protruding from the substrate, the second fin active region extending in the first direction and spaced apart from the first fin active region in a second direction different from the first direction; a gate line intersecting the first and second fin active regions on the substrate and extending in the second direction; a first source/drain region on one side of the gate line in the first fin active region; and a second source/drain region on one side of the gate line in the second fin active region and facing the first source/drain region, wherein a cross-section perpendicular to the first direction of at least one of the first and second source/drain regions has an asymmetrical shape with respect to a respective centerline of the first and second source/drain regions in the second direction extending in a third direction perpendicular to the top surface of the substrate.

BRIEF DESCRIPTION OF THE DRAWINGS

Embodiments of the present disclosure will be more clearly understood from the following detailed description taken in conjunction with the accompanying drawings in which.

DETAILED DESCRIPTION

Hereinafter, embodiments of the inventive concept will be described in detail with reference to the accompanying drawings.

As used herein, an integrated circuit device may refer, for example, to a transistor or a device such as a semiconductor chip (e.g., memory chip and/or logic chip formed from a wafer), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

Figure 1:
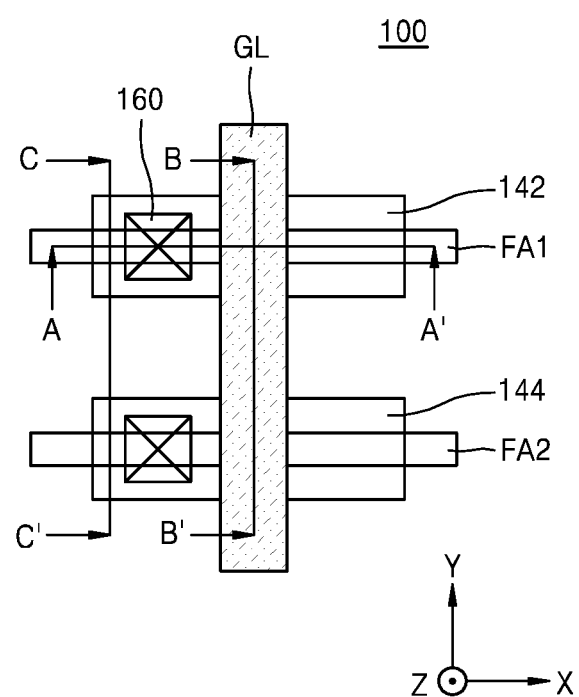
FIG. 1 is a layout diagram illustrating an integrated circuit device according to an example embodiment.
Figure 2:
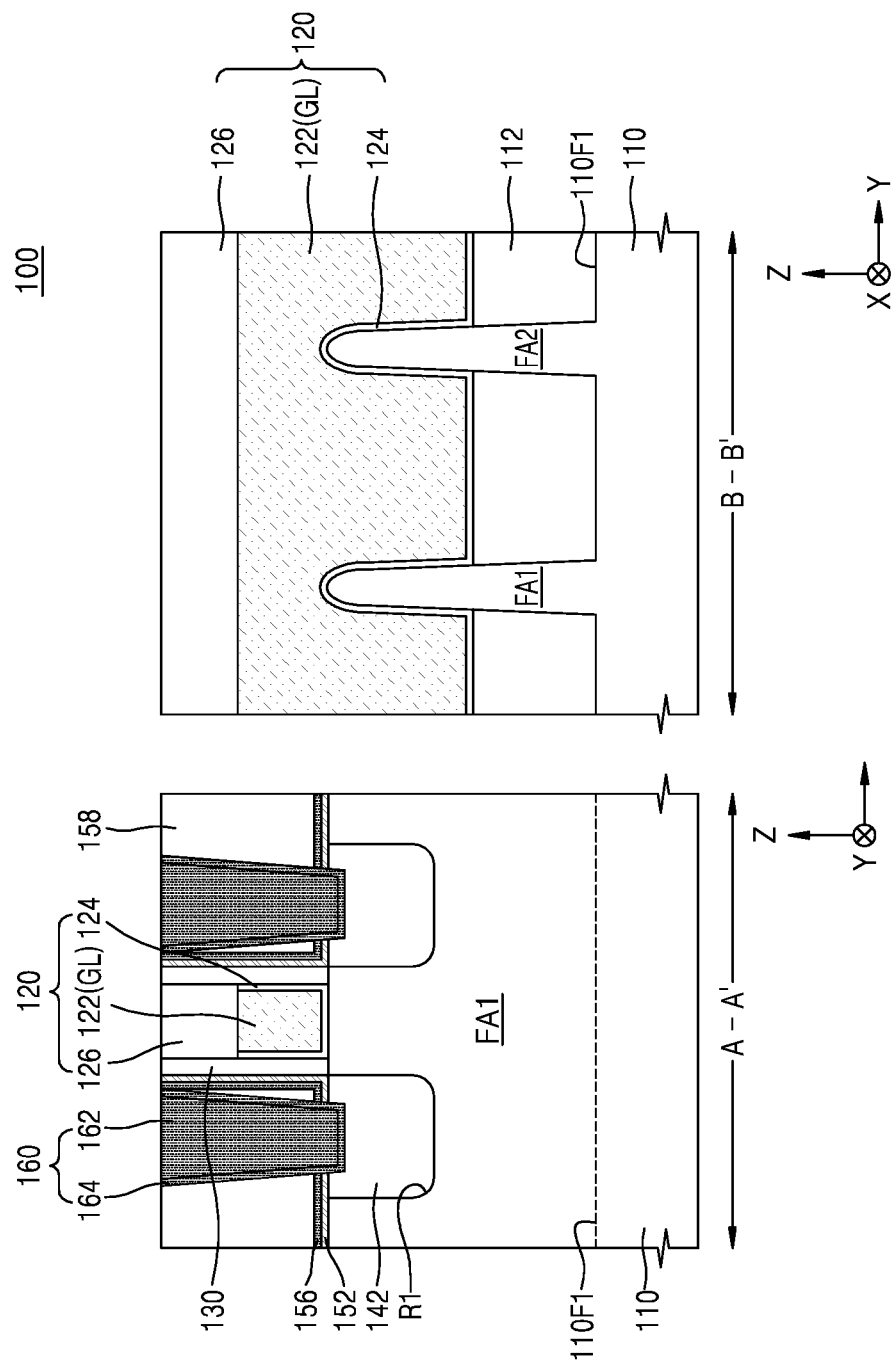
FIG. 2 shows cross-sectional views taken along line A-A' and line B-B' in FIG. 1, respectively, according to example embodiments.
Figure 3:
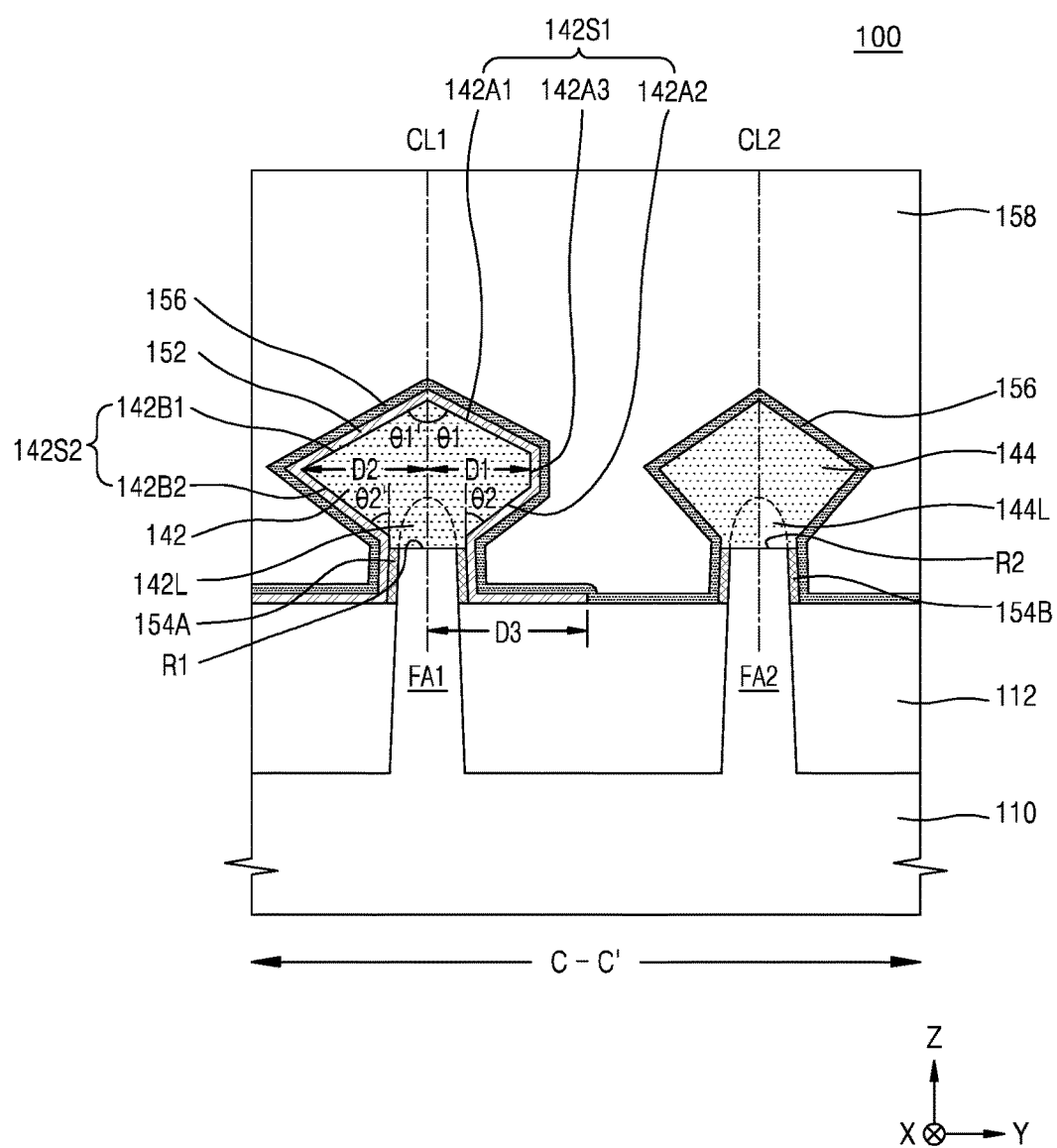
FIG. 3 is a cross-sectional view taken along line C-C' in FIG. 1 according to example embodiments.

FIG. 1 is a layout diagram illustrating an integrated circuit device 100 according to an example embodiment. FIG. 2 shows cross-sectional views taken along line A-A' and line B-B' in FIG. 1, respectively according to example embodiments. FIG. 3 is a cross-sectional view taken along line C-C' in FIG. 1 according to example embodiments. In FIG. 1, only a partial configuration of the integrated circuit device 100 is shown for convenience.

Referring to FIGS. 1 to 3, a first fin active region FA1 and a second fin active region FA2 may protrude from a top surface 110F1 of the substrate 110. The first fin active region FA1 and the second fin active region FA2 may extend in a first direction (X direction in FIG. 1) parallel to the top surface 110F1 of the substrate 110, and may be spaced apart from each other in a second direction (Y direction in FIG. 1). An isolation layer 112 covering bottom portions of both sidewalls of the first and the second fin active regions FA1 and FA2 may be arranged on the substrate 110.

In example embodiments, the substrate 110 may include a Group IV semiconductor such as Si and Ge, a Group IV-IV compound semiconductor such as SiGe and SiC, or a Group III-V compound semiconductor such as GaAs, InAs, and InP. The substrate 110 may include a conductive region, for example, a well doped with impurities or a structure doped with impurities.

In example embodiments, the first fin active region FA1 may be an active region constituting a p-type metal-oxide semiconductor (PMOS) transistor, and the second fin active region FA2 may be an active region constituting an n-type metal-oxide semiconductor (NMOS) transistor. In other example embodiments, the first fin active region FA1 may be an active region constituting an NMOS transistor, and the second fin active region FA2 may be an active region constituting a PMOS transistor. In other example embodiments, each of the first fin active region FA1 and the second fin active region FA2 may be either an active region constituting an NMOS transistor or an active region constituting a PMOS transistor.

A gate structure 120 extending in the second direction (Y direction in FIG. 2) parallel to the top surface 110F1 of the substrate 110 may be arranged on the first fin active region FA1, the second fin active region FA2, and the isolation layer 112. The gate structure 120 may intersect both the first fin active region FA1 and the second fin active region FA2, which are spaced apart from each other in the second direction (Y direction). The gate structure 120 may include a gate electrode 122, a gate insulating layer 124, and a gate capping layer 126.

The gate electrode 122 may correspond to a gate line GL extending in the second direction (Y direction in FIG. 1), as illustrated in FIG. 1. The gate electrode 122 may include doped polysilicon, metals, or a combination thereof. For example, the gate electrode 122 may include Al, Cu, Ti, Ta, W, Mo, TaN, NiSi, CoSi, TiN, WN, TiAl, TiAlN, TaCN, TaC, TaSiN, or a combination thereof, but is not limited thereto. In example embodiments, the gate electrode 122 may include a work-function metal-containing layer and a gap-fill metal layer. The work-function metal-containing layer may include at least one metal of Ti, W, Ru, Nb, Mo, Hf, Ni, Co, Pt, Yb, Tb, Dy, Er and Pd. The gap-fill metal layer may include a W film or an Al film. In example embodiments, the gate electrode 122 may have a stacked structure of TiAlC/TiN/W, a stacked structure of TiN/TaN/TiAlC/TiN/W, or a stacked structure of TiN/TaN/TiN/TiAlC/TiN/W. However, the technical idea of the inventive concept is not limited to above examples.

The gate insulating layer 124 may extend in the second direction on a bottom surface and sidewalls of the gate electrode 122. The gate insulating layer 124 may be between the first and second fin active regions FA1 and FA2 and the gate electrode 122, and between the gate electrode 122 and a top surface of the isolation layer 112. The gate insulating layer 124 may include a silicon oxide film, a silicon oxynitride film, a high-k dielectric film having a dielectric constant higher than that of the silicon oxide film, or a combination thereof. The high-k dielectric film may include a metal oxide or a metal oxynitride. For example, the high-k dielectric film which is used as the gate insulating layer 124 may be any one of $HfO_2$, HfSiO, HfSiON, HfTaO, HfTiO, HfZrO, zirconium oxide, aluminum oxide, an $HfO_2$—$Al_2O_3$ alloy, or a combination thereof, but is not limited thereto.

A gate capping layer 126 may be on the gate electrode 122. The gate capping layer 126 may cover the top surface of the gate electrode 122 and extend in the second direction (Y direction in FIG. 1). In example embodiments, the gate capping layer 126 may include silicon nitride.

Gate spacers 130 may be arranged on both sidewalls of the gate structure 120. The gate spacers 130 may extend in an extending direction of the gate structure 120 on both sidewalls of the gate structure 120. In example embodiments, the gate spacer 130 may include silicon oxide ($SiO_x$), silicon nitride ($SiN_x$), silicon oxynitride ($SiO_xN_y$), silicon carbide nitride ($SiC_xN_y$), silicon oxide carbonitride ($SiO_xC_yN_z$), or a combination thereof.

A first source/drain region 142 may be formed in the first fin active region FA1 on both sides of the gate structure 120. The first source/drain region 142 may include a doped SiGe film, a doped Ge film, a doped SiC film, or a doped InGaAs film, but is not limited thereto. A portion of the first fin active region FA1 on both sides of the gate structure 120 may be removed to form a recess region R1, and the first source/drain region 142 may be formed by growing a semiconductor layer which fills the inside of the recess region R1 via an epitaxial growth process.

In example embodiments, the first source/drain region 142 may include doped SiGe when the first fin active region FA1 is an active region for the PMOS transistor, and may include doped SiC when the first fin active region FA1 is an active region for the NMOS transistor. However, the inventive concept is not limited thereto.

In example embodiments, a source/drain region for the PMOS transistor may be formed by an epitaxial growth (e.g., a selective epitaxial growth, SEG) process using a silicon source gas, e.g., dichlorosilane ($SiH_2Cl_2$) gas, and a germanium source gas, e.g., germane ($GeH_4$) gas to form a single crystalline silicon-germanium layer. A p-type impurity source gas, e.g., diborane ($B_2H_6$) gas may be also used to form a single crystalline silicon-germanium layer doped with p-type impurities.

In example embodiments, a source/drain region for the NMOS transistor may be formed by a SEG process using a silicon source gas, e.g., disilane ($Si_2H_6$) gas and a carbon source gas, e.g., monomethylsilane ($SiH_3CH_3$) gas to form a single crystalline silicon carbide layer. Alternatively, the source/drain region may be formed by a SEG process using only a silicon source gas, e.g., disilane ($Si_2H_6$) gas to form a single crystalline silicon layer. An n-type impurity source gas, e.g., phosphine ($PH_3$) gas may be also used to form a single crystalline silicon carbide layer doped with n-type impurities or a single crystalline silicon layer doped with n-type impurities.

In example embodiments, the first source/drain regions 142 may include a plurality of semiconductor layers of different compositions. For example, the first source/drain region 142 may include a bottom semiconductor layer 142L (refer to FIG. 3), an upper semiconductor layer (not shown), and a capping semiconductor layer (not shown), which sequentially fill the inside of the recess region R1 (refer to FIG. 3). For example, the bottom semiconductor layer 142L, the upper semiconductor layer, and the capping semiconductor layer may each include SiGe, while individual amounts of Si and Ge are different.

A second source/drain region 144 may be arranged in the second fin active region FA2 on both sides of the gate structure 120. The second source/drain region 144 may include a doped SiGe film, a doped Ge film, a doped SiC film, or a doped InGaAs film, but is not limited thereto. A portion of the second fin active region FA2 on both sides of the gate structure 120 may be removed to form a recess region R2, and the second source/drain region 144 may be formed by growing a semiconductor layer which fills the inside of the recess region R2 via an epitaxial growth process.

In example embodiments, the second source/drain region 144 may include doped SiC when the second fin active region FA2 is the active region for the NMOS transistor and may include doped SiGe when the second fin active region FA2 is the active region for the PMOS transistor.

In example embodiments, the second source/drain regions 144 may include a plurality of semiconductor layers of different compositions. For example, the second source/drain region 144 may include a bottom semiconductor layer 144L (refer to FIG. 3), an upper semiconductor layer (not shown), and a capping semiconductor layer (not shown), which sequentially fill the inside of the recess region R2 (refer to FIG. 3). For example, the bottom semiconductor layer 144L, the upper semiconductor layer, and the capping semiconductor layer may each include SiGe, while individual amounts of Si and Ge are different.

In example embodiments, as illustrated in FIG. 3, the first source/drain region 142 and the second source/drain region 144 may have different cross-sectional shapes. For example, a cross-section perpendicular to the first direction (X direction) of the first source/drain region 142 (that is, a cross-section taken along a Y-Z plane) may have an asymmetrical shape with respect to a first centerline CL1, of the first source/drain region 142, extending in a third direction (Z direction). Here, the first centerline CL1 may indicate an imaginary line extending in the third direction from the center point of a top surface of the first fin active region FA1 in a second direction (Y direction), contacting the first source/drain region 142. On the contrary, a cross-section perpendicular to the first direction (X direction) of the second source/drain region 144 may have a symmetrical shape with respect to a second centerline CL2 of the second source/drain region 144 extending in the third direction. Here, the second centerline CL2 may indicate an imaginary line extending in the third direction from a center point of a top surface of the second fin active region FA2 in the second direction, contacting the second source/drain region 144.

In other example embodiments, the second source/drain region 144 may also have an asymmetrical shape with respect to the second centerline CL2.

As illustrated in FIG. 3, the first source/drain region 142 may include a first sidewall 142S1 facing the second source/drain region 144, and a second sidewall 142S2 opposite the first sidewall 142S1. The first sidewall 142S1 may include a first portion 142A1, a second portion 142A2, and a third portion 142A3. The first portion 142A1 may extend from an uppermost surface of the first source/drain region 142 at a first inclination angle θ1 with respect to the third direction. The second portion 142A2 may extend from a bottom surface of the first source/drain region 142 at a second inclination angle θ2 with respect to the third direction. For example, the first inclination angle θ1 and the second inclination angle θ2 may be in the range of about 40 to about 60 degrees (°), but are not limited thereto. The third portion 142A3 may be between the first portion 142A1 and the second portion 142A2, and may extend substantially parallel to the third direction. For example, the third portion 142A3 of the first sidewall 142S1 may extend substantially perpendicular to the top surface 110F1 of the substrate 110.

The second sidewall 142S2 of the first source/drain region 142 may include a first portion 142B1 and a second portion 142B2. The first portion 142B1 may extend from the uppermost surface of the first source/drain region 142 at a third inclination angle θ1' with respect to the third direction. The second portion 142B2 may extend from the bottom surface of the first source/drain region 142 at a fourth inclination angle θ2' with respect to the third direction, and may meet the first portion 142B1. As an example, the first inclination angle θ1 may be substantially the same as the third inclination angle θ1' and the second inclination angle θ2 may be substantially the same as the fourth inclination angle θ2'. As another example, the first inclination angle θ1 may be different from the third inclination angle θ1' and the second inclination angle θ2 may be different from the fourth inclination angle θ2'. In example embodiments, each of the first through fourth inclination angles θ1, θ2, θ1', and θ2' may be in the range of about 40 to about 60°, but are not limited thereto.

As illustrated in FIG. 3, the first sidewall 142S1 may have a first maximum distance D1 in the second direction (Y direction) from the first centerline CL1 to a side surface of the third portion 142A3 of the first sidewall 142S1. As an example, the second sidewall 142S2 may have a second maximum distance D2 from the first centerline CL1 to a point (e.g., a corner) where the first portion 142B1 and the second portion 142B2 of the second sidewall 142S2 meet each other. The first maximum distance D1 may be less than the second maximum distance D2.

In an example process of forming the first source/drain region 142, after the recess region R1 is formed by removing a portion of the first fin active region FA1, the first source/drain region 142 may be grown by an epitaxial growth process and a second mask layer (refer to 330 in FIG. 13) covering a portion of the first source/drain region 142 may be formed. At this time, a portion of the sidewalls, of the first source/drain region 142, adjacent to the second source/drain region 144 may be exposed to the outside of the second mask layer 330 and a trimming (e.g., etching) process may be performed to remove only a portion of the exposed sidewalls. By the trimming process performed only onto the first sidewall 142S1 of the first source/drain region 142, the third portion 142A3 may be formed extending substantially parallel to the third direction (Z direction) (for example, extends perpendicular to the top surface 110F1 of the substrate 110). By the trimming process, a separation distance between the second source/drain region 144 and the first source/drain region 142 may be increased, and thus, an occurrence of an electric short may be prevented.

A first insulating liner 152 may be on the first source/drain region 142 and the isolation layer 112. The first insulating liner 152 may be conformally formed on the first sidewall 142S1 and the second sidewall 142S2 of the first source/ drain region 142, and may cover a whole surface of the first source/drain region 142. A portion of the first insulation liner 152 may extend in the third direction (Z direction) on the third portion 142A3 of the first sidewall 142S1. The first insulating liner 152 may include at least one of silicon nitride, silicon oxynitride, silicon oxide carbonitride, and silicon oxide.

As illustrated in FIG. 3, the first insulating liner 152 may extend onto the isolation layer 112 between the first source/drain region 142 and the second source/drain region 144. A third maximum distance D3 which is a distance in the second direction from the first centerline CL1 of the first source/drain region 142 to an edge of the first insulating liner 152 between the first source/drain region 142 and the second source/drain region 144 may be greater than the first maximum distance D1 which is a distance in the second direction from the first centerline CL1 of the first source/drain region 142 to the side surface of the third portion 142A3 of the first sidewall 142S1 of the first source/drain region 142.

An insulating spacer 154A may be selectively arranged between the first insulating liner 152 and both sidewalls of the first fin active region FA1 under the first source/drain region 142. The insulating spacer 154A may be arranged on both sidewalls of the first fin active region FA1 at a level lower than the bottom surface of the first source/drain region 142 and at a level higher than a top surface of the isolation layer 112, and the first insulating liner 152 may be arranged on the insulating spacer 154A.

A second insulating liner 156 may be on the second source/drain region 144 and the isolation layer 112. The second insulating liner 156 may be conformally formed on whole sidewalls of the second source/drain region 144 and may cover a whole surface of the second source/drain region 144. In addition, as illustrated in FIG. 3, the second insulating liner 156 may be on a top surface of the first insulating liner 152, but the technical idea of the inventive concept is not limited thereto. The second insulating liner 156 may include at least one of silicon nitride, silicon oxynitride, silicon oxide carbonitride, and silicon oxide.

An insulating spacer 154B may be selectively arranged between the second insulating liner 156 and both sidewalls of the second fin active region FA2 under the second source/drain region 144. The insulating spacer 154B may be arranged on both sidewalls of the second fin active region FA2 at a level lower than the bottom surface of the second source/drain region 144 and at a level higher than the top surface of the isolation layer 112, and the second insulating liner 156 may be arranged on the insulating spacer 154B.

An inter-gate insulating layer 158 may be formed to cover the first and second source/drain regions 142 and 144 on both sidewalls of the gate structure 120. In example embodiments, the inter-gate insulating layer 158 may be formed directly on a top surface of the second insulating liner 156. In other embodiments, an additional insulating liner (not shown) conformally covering the second insulating liner 156 may be formed and the inter-gate insulating layer 158 may be formed on the additional insulating liner.

A contact structure 160 may be on the first and second source/drain regions 142 and 144. In example embodiments, the contact structure 160 may include a contact plug 162 and a conductive barrier layer 164. In example embodiments, the contact plugs 162 may include at least one of W, Co, Ni, Ru, Cu, Al, silicides thereof, or an alloy thereof. The conductive barrier layer 164 may be arranged to surround sidewalls of the contact plugs 162. The conductive barrier layer 164 may include Ti, Ta, TiN, TaN, or a combination thereof.

A silicide layer (not shown) may be selectively formed between the first and second source/drain regions 142 and 144, and the contact structure 160. The silicide layer (not shown) may include a metal silicide material such as nickel silicide, cobalt silicide, and tungsten silicide.

In general, the first and second source/drain regions 142 and 144 may be formed by an epitaxial growth process, and it may be relatively difficult to precisely control sizes of the source/drain regions which grow in the epitaxial growth process. Thus, some source/drain regions may overgrow and their sizes (widths and heights) may become relatively large. On the other hand, as the down-scaling of the integrated circuit device progresses, a distance between adjacent source/drain regions may be also reduced, so that a certain overgrown source/drain region may be located very close to other source/drain regions adjacent thereto. When a portion of the certain overgrown source/drain region is not completely covered by a mask layer (refer to 340 in FIG. 15), a parasitic semiconductor layer may be undesirably formed on an exposed surface of the certain overgrown source/drain region in the epitaxial growth process of other source/drain region adjacent thereto, and then an electrical short may occur between the source/drain regions.

In example embodiments, the second mask layer (refer to 330 in FIG. 13) covering the first source/drain region 142 may be formed after the first source/drain region 142 is grown. At this time, a portion of the first sidewall 142S1 of the first source/drain region 142 adjacent to a position where the second source/drain region 144 is to be formed may be exposed to the outside of the second mask layer 330, and a trimming process of removing only the exposed portion of the first sidewall 142S1 may be performed. By the trimming process of only the first sidewall 142S1 of the first source/drain region 142, the third portion 142A3 may be formed extending substantially parallel to the third direction (Z direction) (for example, extends perpendicular to the top surface 110F1 of the substrate 110). By the trimming process, a separation distance between the second source/drain region 144 and the first source/drain region 142 may be increased. Thus, the first source/drain region 142 may be completely covered by the third mask layer (refer to 340 in FIG. 15) in a subsequent epitaxial growth process of the second source/drain region 144, and accordingly, a parasitic semiconductor layer may not be formed in a portion of the first source/drain region 142 during the epitaxial growth process of the second source/drain region 144. Thus, an occurrence of an electrical short between the first source/drain region 142 and the second source/drain region 144 may be prevented.

Figure 4:
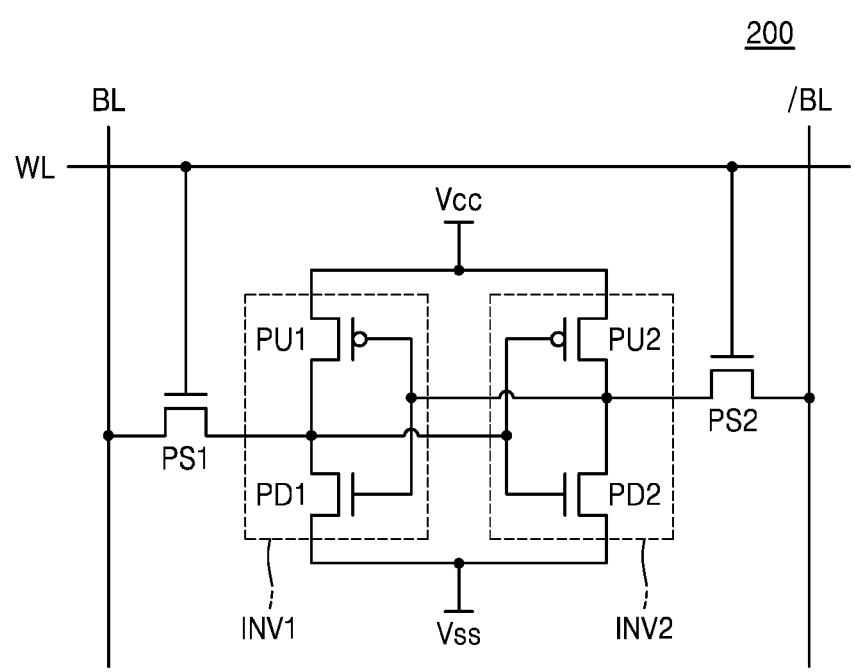
FIG. 4 is an equivalent circuit diagram showing an integrated circuit device according to an example embodiment.

FIG. 4 is an equivalent circuit diagram showing an integrated circuit device 200 according to an example embodiment. FIG. 4 shows a circuit diagram of a 6T static random-access memory (SRAM) cell including six transistors.

Referring to FIG. 4, the integrated circuit device 200 may include a pair of inverters INV1 and INV2 connected in parallel between a power supply node Vcc and a ground node Vss, and a first pass transistor PS1 and a second pass transistor PS2 connected to output nodes of the inverters INV1 and INV2, respectively. The first pass transistor PS1 and the second pass transistor PS2 may be connected to a bit line BL and a complementary bit line/BL, respectively. Gates of the first pass transistor PS1 and the second pass transistor PS2 may be connected to a word line WL, respectively.

The first inverter INV1 may include a first pull-up transistor PU1 and a first pull-down transistor PD1 which are connected in series, and the second inverter INV2 may include a second pull-up transistor PU2 and a second pull-down transistor PD2 which are connected in series. The first pull-up transistor PU1 and the second pull-up transistor PU2 may be PMOS transistors, and the first pull-down transistor PD1 and the second pull-down transistor PD2 may be NMOS transistors. In other examples, each of the first and second pull-up transistors PU1 and PU2 and the first and second pull-down transistors PD1 and PD2 may be NMOS transistor.

In order to constitute one latch circuit by using the first and second inverters INV1 and INV2, an input node of the first inverter INV1 may be connected to the output node of the second inverter INV2, and the input node of the second inverter INV2 may be connected to the output node of the first inverter INV1.

Figure 5:
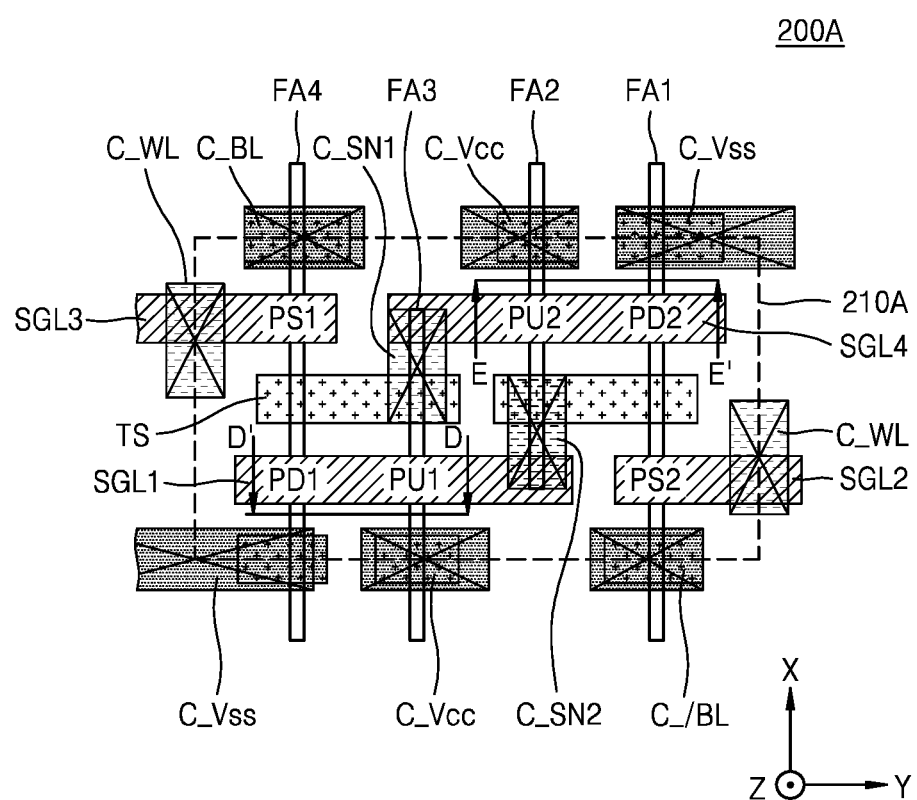
FIG. 5 is a layout diagram illustrating an integrated circuit device according to an example embodiment.
Figure 6:
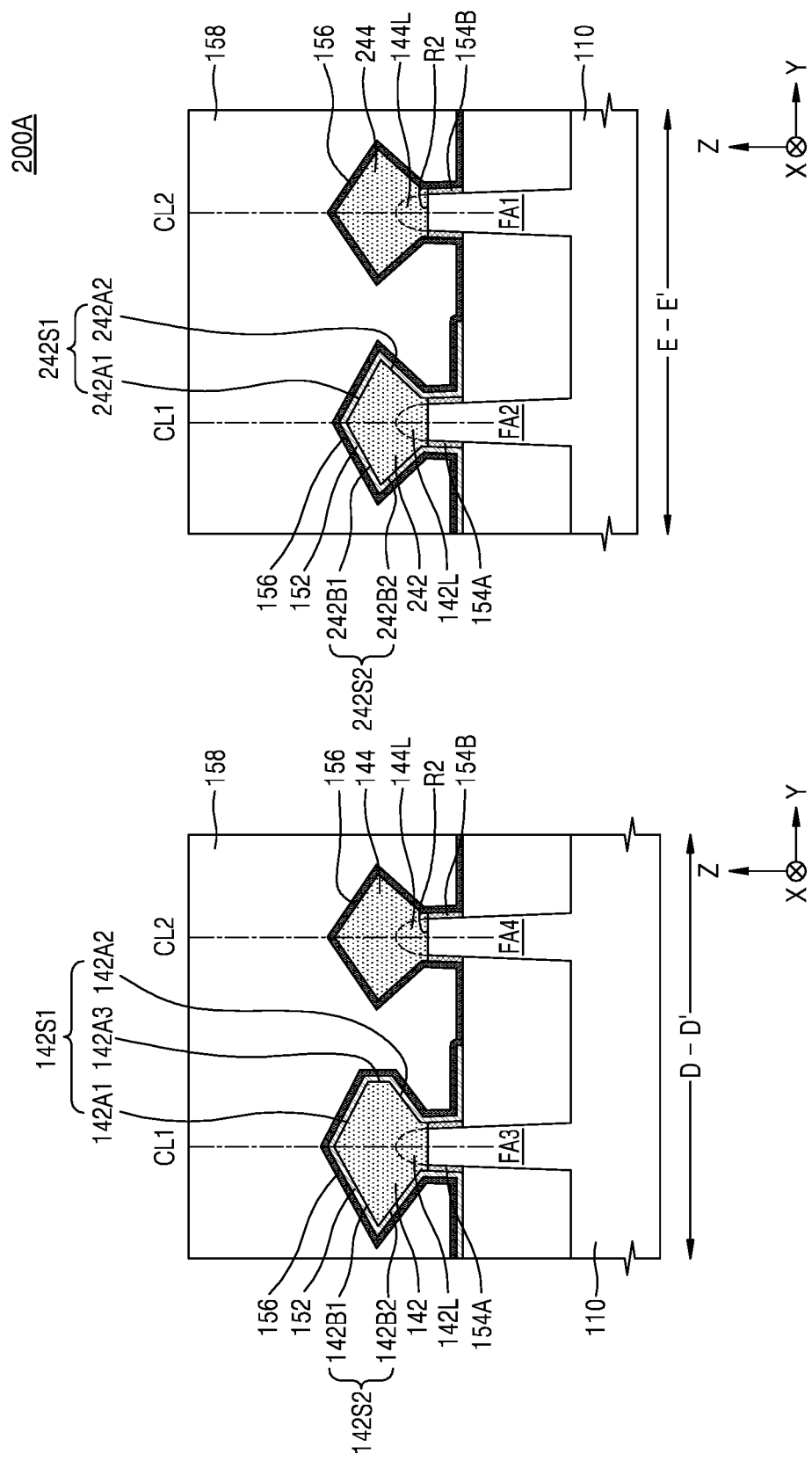
FIG. 6 shows cross-sectional views taken along line D-D' and line E-E' in FIG. 5, respectively according to example embodiments.

FIG. 5 is a layout diagram illustrating an integrated circuit device 200A according to an example embodiment. FIG. 6 shows cross-sectional views taken along line D-D' and line E-E' in FIG. 5, respectively according to example embodiments.

Referring to FIGS. 5 and 6, the integrated circuit device 200A may include an SRAM cell 210A on the substrate 110. The SRAM cell 210A may include six fin field-effect transistors (finFETs).

The SRAM cell 210A may include a plurality of fin active regions FA1, FA2, FA3, and FA4 extending parallel to each other in the first direction (X direction). The plurality of fin active regions FA1, FA2, FA3, and FA4 may protrude in the Z direction from the top surface of the substrate 110, respectively.

In addition, the SRAM cell 210A may include a plurality of gate lines SGL1, SGL2, SGL3, and SGL4, which cover both sidewalls and top surfaces of the plurality of fin active regions FA1, FA2, FA3, and FA4, and extend in a second direction (Y direction) intersecting the first direction (X direction) in parallel with each other. The plurality of gate lines SGL1, SGL2, SGL3, and SGL4 may have characteristics similar to the gate line GL described with reference to FIGS. 1 through 3.

The first pull-up transistor PU1, the first pull-down transistor PD1, the first pass transistor PS1, the second pull-up transistor PU2, the second pull-down transistor PD2, and the second pass transistor PS2, which constitute the SRAM cell 210A, may each be realized by a fin transistor. Particularly, the first pull-up transistor PU1 and the second pull-up transistor PU2 may each include a PMOS transistor, and the first pull-down transistor PD1, the second pull-down transistor PD2, the first pass transistor PS1, and the second pass transistor PS2 may each include an NMOS transistor.

A transistor may be formed at each intersection of the plurality of fin active regions FA1, FA2, FA3, and FA4 extending in the X direction and the plurality of gate lines SGL1, SGL2, SGL3, and SGL4 extending in the Y direction.

The first pass transistor PS1 may be formed at an intersection of the fin active region FA4 and the gate line SGL3, and the second pass transistor PS2 may be formed at an intersection of the fin active region FA1 and the gate line SGL2. The first pull-down transistor PD1 may be formed at an intersection of the fin active region FA4 and the gate line SGL1, and the second pull-down transistor PD2 may be formed at an intersection of the fin active region FA1 and the gate line SGL4. The first pull-up transistor PU1 may be formed at an intersection of the fin active region FA3 and the gate line SGL1, and the second pull-up transistor PU2 may be formed at an intersection of the fin active region FA2 and the gate line SGL4.

The plurality of gate lines SGL1, SGL2, SGL3, and SGL4 may each be shared by two transistors, respectively. For example, the gate line SGL1 may be shared by the first pull-down transistor PD1 and the first pull-up transistor PU1, and the gate line SGL4 may be shared by the second pull-down transistor PD2 and the second pull-up transistor PU2.

As illustrated in FIG. 5, various contact structures may be arranged in the SRAM cell 210A. In detail, one word line contact C_WL may be connected to the gate line SGL3 of the first pass transistor PS1 and another word line contact C_WL may be connected to the gate line SGL2 of the second pass transistor PS2. A bit line contact C_BL may be connected to a drain of the first pass transistor PS1 and a complementary bit line contact C_/BL may be connected to the drain of the second pass transistor PS2. One power node contact C_Vcc may be connected to a source of the first pull-up transistor PU1 and another power node contact C_Vcc may be connected to the source of the second pull-up transistor PU2. One ground node contact C_Vss may be connected to the source of the first pull-down transistor PD1 and another ground node contact C_Vss may be connected to the source of the second pull-down transistor PD2. A first storage node contact C_SN1 may be simultaneously connected to the source of the first pass transistor PS1 and to the drains of the first pull-up transistor PU1 and the first pull-down transistor PD1. A second storage node contact C_SN2 may be simultaneously connected to the source of the second pass transistor PS2 and to the drains of the second pull-up transistor PU2 and the second pull-down transistor PD2.

A trench silicide (TS) may be formed on first, second, third, and fourth source/drain regions 142, 144, 242, and 244 to provide an electrical connection between the fin active regions FA1, FA2, FA3, and FA4 and the contact structures. For example, the TS may include at least one of W, Co, Ni, Ru, Cu, Al, silicides thereof, or an alloy thereof.

The gate lines SGL1 and SGL4 may be shared by two transistors having channels of different conductivity types. For example, the gate line SGL1 may be shared by the first pull-down transistor PD1 including the NMOS transistor, and the first pull-up transistor PU1 including the PMOS transistor. The gate line SGL4 may be shared by the second pull-up transistor PU2 including the PMOS transistor and the second pull-down transistor PD2 including the NMOS transistor.

In example embodiments, the first source/drain region 142 of the first pull-up transistor PU1 may have an asymmetrical cross-section (for example, a cross-section perpendicular to the first direction (X direction)), while the second source/drain region 144 of the first pull-down transistor PD1 may have a symmetrical cross-section. As illustrated in FIG. 6, the first source/drain region 142 of the first pull-up transistor PU1 may be formed on the fin active region FA3, the second source/drain region 144 of the first pull-down transistor PD1 may be formed on the fin active region FA4, and the first source/drain region 142 may have a different cross-sectional profile from the second source/drain region 144. Characteristics of the first source/drain region 142 of the first pull-up transistor PU1 and the second source/drain region 144 of the first pull-down transistor PD1 may be similar to the first and second source/drain regions 142 and 144 described with reference to FIGS. 1 through 3.

In example embodiments, the third source/drain region 242 of the second pull-up transistor PU2 may have a cross-section of a symmetrical shape, and the fourth source/drain region 244 of the second pull-down transistor PD2 may also have a cross-section of a symmetrical shape. As illustrated in FIG. 6, the third source/drain region 242 of the second pull-up transistor PU2 may be formed on the fin active region FA2, the fourth source/drain region 244 of the second pull-down transistor PD2 may be formed on the fin active region FA1, and the third source/drain region 242 may have a cross-sectional profile similar to the fourth source/drain region 244.

The third source/drain region 242 may include a first sidewall 242S1 facing the fourth source/drain region 244 and a second sidewall 242S2 opposite the first sidewall 242S1. The first sidewall 242S1 may include a first portion 242A1 and a second portion 242A2, and the first portion 242A1 may extend obliquely with respect to the third direction from an uppermost surface of the third source/drain region 242. The second portion 242A2 may extend obliquely with respect to the third direction from a bottom surface of the third source/drain region 242 and may meet the first portion 242A1. The second sidewall 242S2 of the third source/drain region 242 may include a first portion 242B1 and a second portion 242B2. The first portion 242B1 may extend obliquely with respect to the third direction from the uppermost surface of the third source/drain region 242. The second portion 242B2 may extend obliquely with respect to the third direction from a bottom surface of the third source/drain region 242 and may meet the first portion 242B1.

In an example process of forming the first and third source/drain regions 142 and 242, since a portion of the sidewalls of the first source/drain region 142 is removed and a portion of the sidewalls of the third source/drain region 242 is not removed, the first source/drain region 142 may have a cross-section of an asymmetrical shape, while the third source/drain region 242 may have a cross-section of a symmetrical shape.

In general, the first and third source/drain regions 142 and 242 may be formed by an epitaxial growth process, and since it is relatively difficult to precisely control the sizes of the source/drain regions which grow in the epitaxial growth process, some source/drain regions may overgrow and sizes (widths and heights) thereof may be relatively large. For example, the first source/drain region 142 may be formed to have a greater width and a greater height than the third source/drain region 242.

However, according to the above-described integrated circuit device 200A, the second mask layer (refer to 330 in FIG. 13) covering the first and third source/drain regions 142 and 242 may be formed after the first and third source/drain regions 142 and 242 are grown. At this time, a portion of the first sidewall 142S1 of the first source/drain region 142 adjacent to a position where the second source/drain region 144 is to be formed may be exposed to the outside of the second mask layer 330, while the third source/drain region 242 may not be exposed to the outside of the second mask layer 330. Thereafter, only a portion of the exposed first sidewall 142S1 of the first source/drain region 142 may be removed by a trimming process.

For example, even though the first source/drain region 142 is overgrown, the distance between the second source/drain region 144 and the first source/drain region 142 may be increased by the trimming process. Also, a size of the first source/drain region 142, which grows in the epitaxial growth process may precisely controlled by the second mask layer 330 (refer to FIG. 13). The first and third source/drain regions 142 and 242 may be completely covered by the third mask layer 340 (refer to FIG. 15) in a subsequent process in which the second and fourth source/drain regions 144 and 244 are grown, and accordingly, the parasite semiconductor layer may not be formed on a portion of surfaces of the first and third source/drain regions 142 and 242 in the epitaxial growth process of the second and fourth source/drain regions 144 and 244.

According to the above-described integrated circuit device 200A, even though a portion of the source/drain region is overgrown, the occurrence of electrical shorts between adjacent source/drain regions may be prevented.

It is illustrated in FIGS. 5 and 6 that one of the first and third source/drain regions 142 and 242 of the first and second pull-up transistors PU1 and PU2 may have a cross-section of an asymmetric shape, and the second and fourth source/drain regions 144 and 244 of the first and second pull-down transistors PD1 and PD2 may have a cross-section of a symmetrical shape. Alternatively, one of the second and fourth source/drain regions 144 and 244 of the first and second pull-down transistors PD1 and PD2 may have a cross-section of an asymmetric shape, while the first and third source/drain regions 142 and 242 of the first and second pull-up transistors PU1 and PU2 may have a cross-section of a symmetrical shape.

In addition, contrary to what is illustrated in FIGS. 5 and 6, both of the first and third source/drain regions 142 and 242 of the first and second pull-up transistors PU1 and PU2 may have a cross-section of an asymmetric shape, while the second and fourth source/drain regions 144 and 244 of the first and second pull-down transistors PD1 and PD2 may have a cross-section of a symmetrical shape. Alternatively, both of the second and fourth source/drain regions 144 and 244 of the first and second pull-down transistors PD1 and PD2 may have a cross-section of an asymmetric shape, while the first and third source/drain regions 142 and 242 of the first and second pull-up transistors PU1 and PU2 may have a cross-section of a symmetrical shape.

In addition, contrary to what is illustrated in FIGS. 5 and 6, all of the first and third source/drain regions 142 and 242 of the first and second pull-up transistors PU1 and PU2 and the second and fourth source/drain regions 144 and 244 of the first and second pull-down transistors PD1 and PD2 may have a cross-section of an asymmetric shape. In this case, each of the first through fourth source/drain regions 142, 144, 242, and 244 of the first pull-up transistor PU1, first pull-down transistor PD1, second pull-up transistor PU2, and second pull-down transistor PD2, respectively, has a portion formed extending substantially parallel to the third direction (Z direction) at a position between the first and second source/drain regions 142 and 144 of the first pull-up transistor PU1 and first pull-down transistor PD1 and at a position between the third and fourth source/drain regions 242 and 244 of the second pull-up transistor PU2 and second pull-down transistor PD2, respectively.

FIGS. 7 through 20 are cross-sectional views illustrating a method of manufacturing the integrated circuit device 100, according to example embodiments. In FIGS. 7 through 20, cross-sections taken along line A-A' and line C-C' in FIG. 1 are shown in the order of processes. In FIGS. 7 through 20, the same reference numerals as those in FIGS. 1 through 6 may denote the same components.

Figure 7:
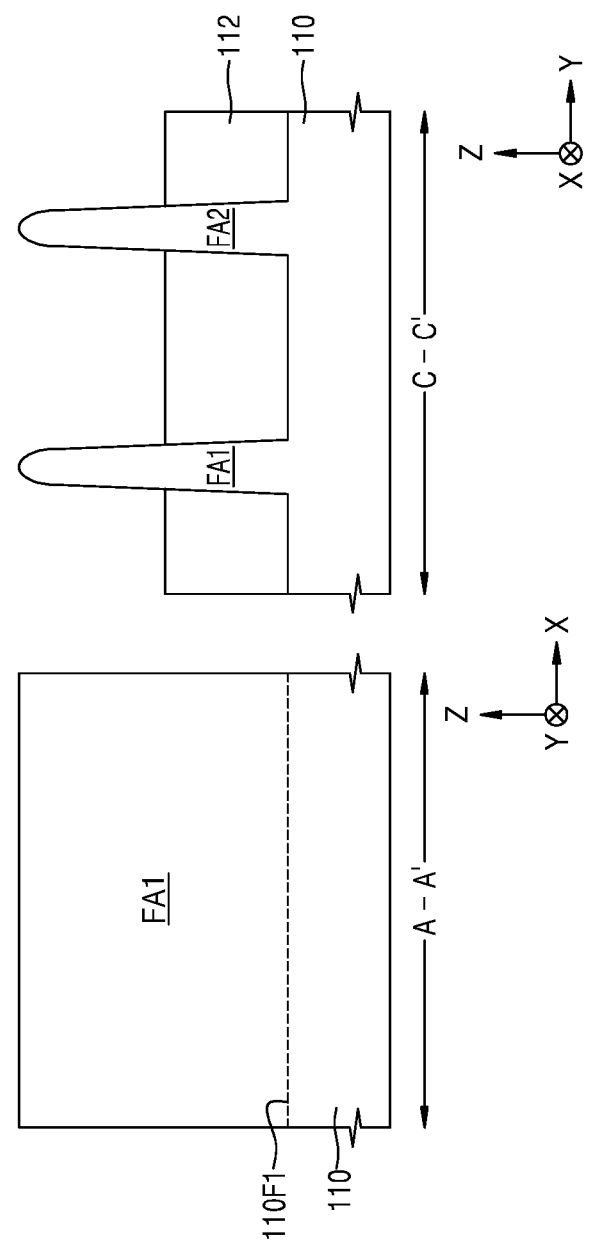
FIGS. 7 through 20 are cross-sectional views illustrating a method of manufacturing an integrated circuit device according to example embodiments.

Referring to FIG. 7, a portion of an active region of the substrate 110 may be etched to form the first and second fin active regions FA1 and FA2 which vertically protrude from the top surface 110F1 of the substrate 110 and extend in the first direction (X direction in FIG. 7).

The isolation layer 112 covering both sidewalls of the first and second fin active regions FA1 and FA2 may be formed on the substrate 110. Even though not shown in FIG. 7, an interfacial layer (not shown) conformally covering the sidewalls of the first and second fin active regions FA1 and FA2 may be formed between the isolation layer 112 and the first and second fin active regions FA1 and FA2.

Figure 8:
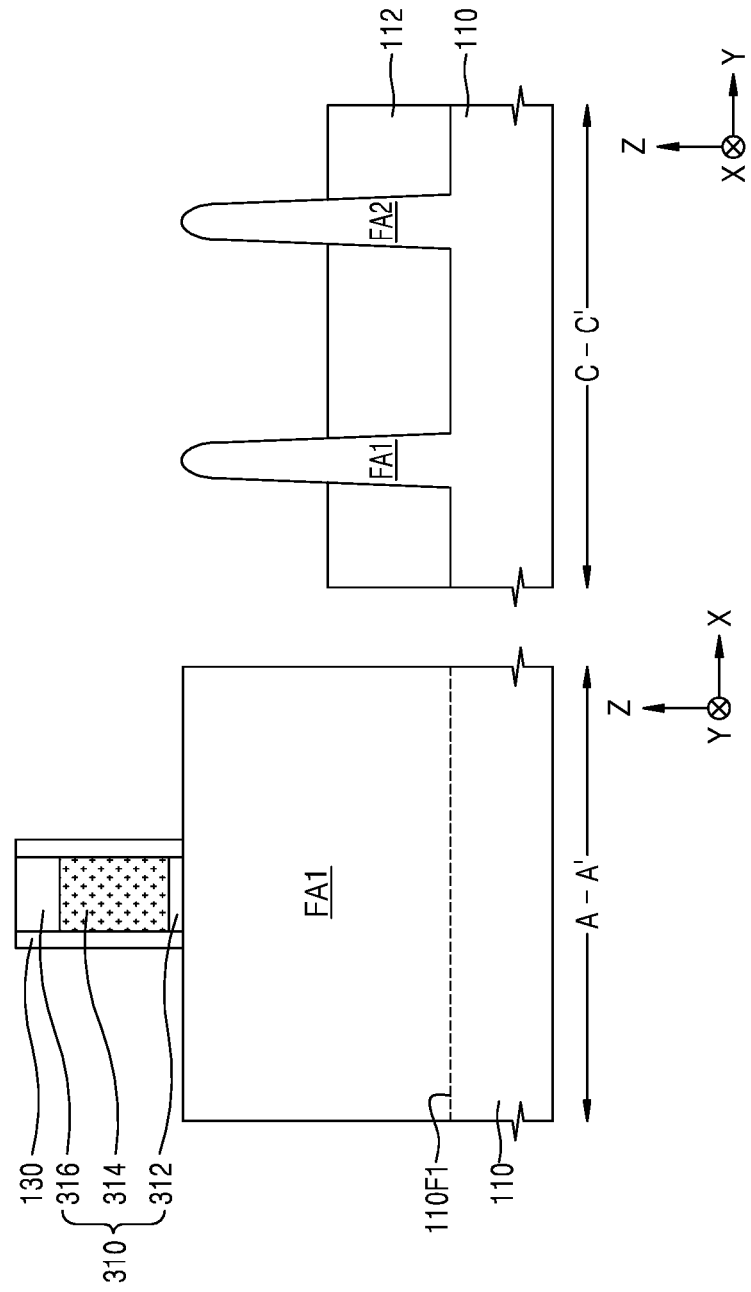

Referring to FIG. 8, after a sacrificial gate insulating layer (not shown), a sacrificial gate conductive layer (not shown), and a hard mask pattern (e.g., a gate hard mask pattern) 316 are sequentially formed on the substrate 110, the sacrificial gate conductive layer and the sacrificial gate insulating layer may be patterned by using the hard mask pattern 316 as an etching mask to form a sacrificial gate 314 and a sacrificial gate insulating layer pattern 312. Here, the sacrificial gate insulating layer pattern 312, the sacrificial gate 314, and the hard mask pattern 316 may be referred to as a sacrificial gate structure 310. In example embodiments, the hard mask pattern 316 may include at least one of silicon nitride, silicon oxynitride, silicon oxide carbonitride, and silicon oxide.

Thereafter, a spacer insulating layer (not shown) covering the sacrificial gate structure 310 may be formed by an atomic layer deposition (ALD) process or a chemical vapor deposition (CVD) process. Thereafter, the gate spacers 130 may remain on the sidewalls of the sacrificial gate structure 310 by performing an anisotropic etching process on the spacer insulating layer. The gate spacer 130 may include silicon nitride, but is not limited thereto.

Figure 9:
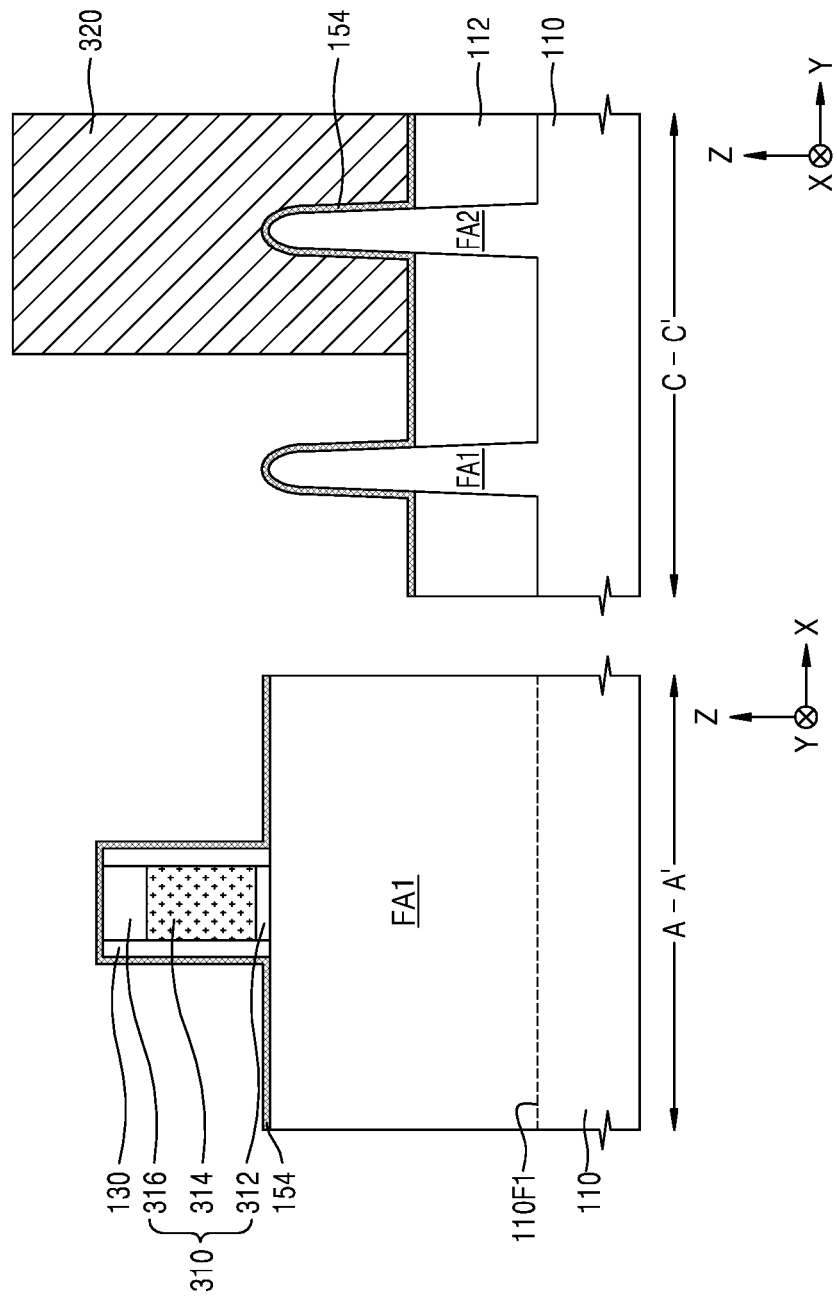

Referring to FIG. 9, an insulating spacer layer 154 may be formed on the sacrificial gate structure 310, the isolation layer 112, and the first and second pinned active regions FA1 and FA2. The insulating spacer layer 154 may be formed, for example, by an ALD process or a CVD process by using silicon nitride, silicon oxynitride, silicon oxide carbonitride, silicon oxide, or a combination thereof. Even though the insulating spacer layer 154 is shown as a single layer in FIG. 9, the insulating spacer layer 154 may alternatively include a stacked structure of a plurality of insulating layers.

Thereafter, a first mask layer 320 may be formed which covers the second fin active region FA2 on the insulating spacer layer 154 and exposes the first fin active region FA1. The first mask layer 320 may be formed by using, for example, a spin on hard mask (SOH) material or a spin on dielectric (SOD) material. The first mask layer 320 may be a photo mask pattern or a photo mask layer.

Figure 10:
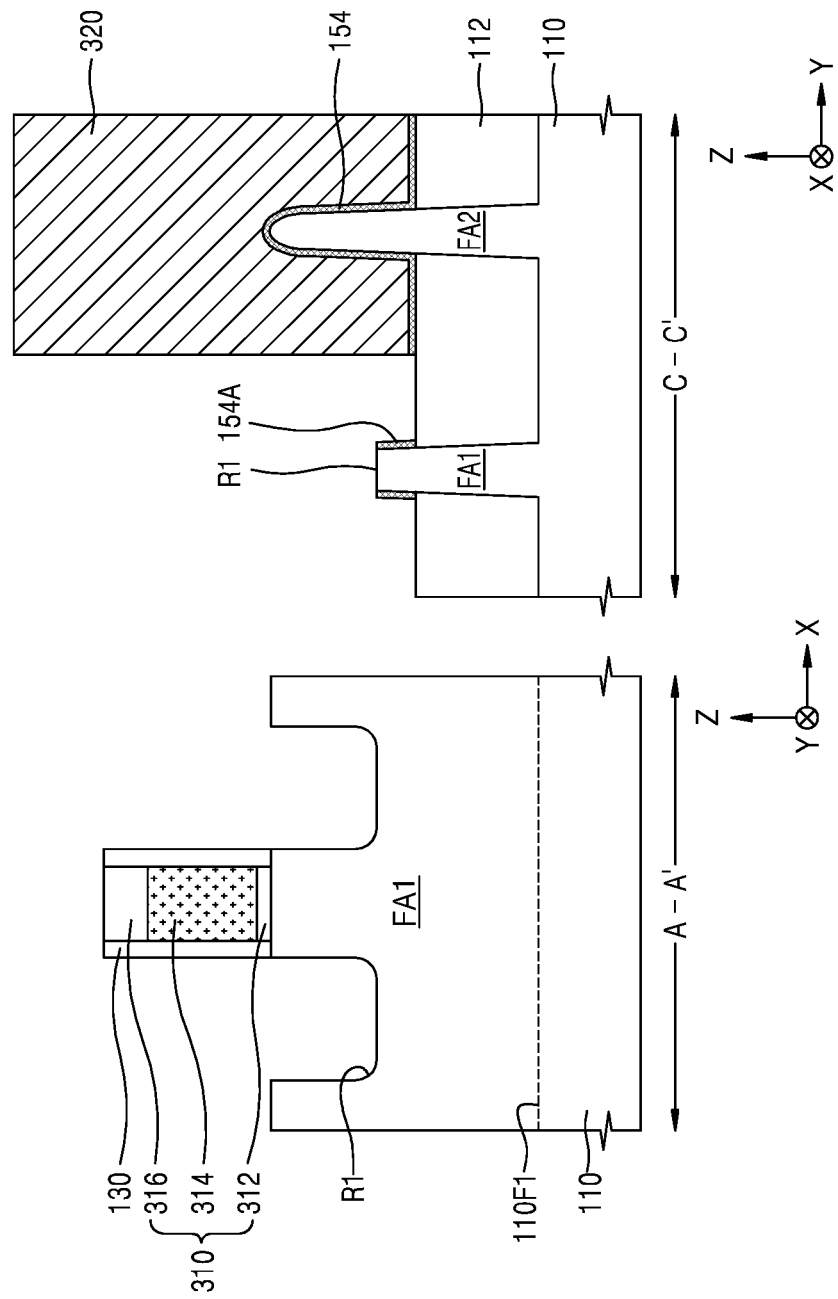

Referring to FIG. 10, the recess region R1 may be formed by etching a portion of the first fin active region FA1. A top portion of the insulating spacer layer 154 formed on the first fin active region FA1 may also be removed together with the etched portion of the first fin active region FA1, and the insulating spacer 154A may remain on both sidewalls of the first fin active region FA1 on the isolation layer 112. For example, the insulating spacer 154A may remain on the sidewalls of the first fin active region FA1 by performing an anisotropic etching process on the insulating spacer layer 154. The insulating spacer layer 154 on sidewalls and a top surface of the sacrificial gate structure 310 may also be removed in the etching process.

Thereafter, the first mask layer 320 may be removed. For example, the first mask layer 320 may be removed by an etching process. The etching process may include wet etching, dry etching, or combination thereof.

Figure 11:
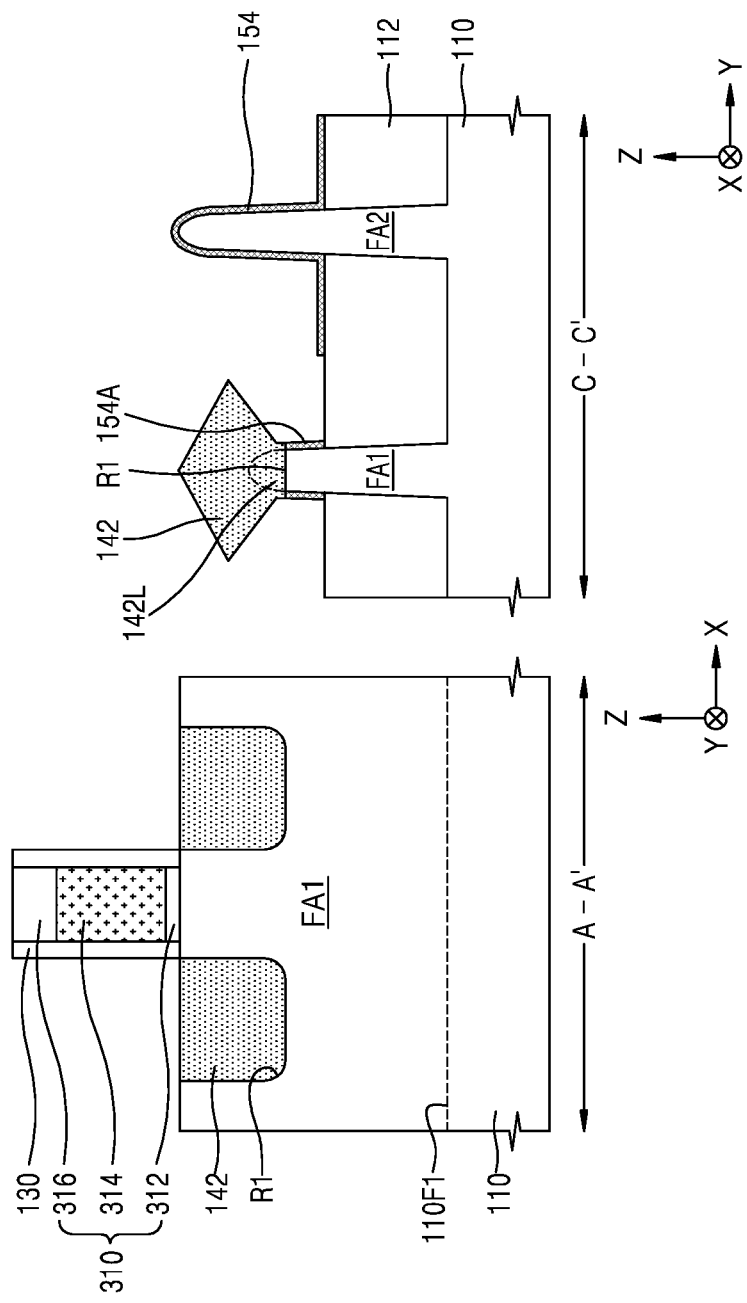

Referring to FIG. 11, the first source/drain region 142 may be formed to fill the recess region R1.

In example embodiments, the first source/drain region 142 may be formed by an epitaxial growth process by using, as seed layers, the sidewalls of the first fin active region FA1 exposed on an inner-wall of the recess region R1 and the top surface of the substrate 110. The epitaxial growth process may be a vapor-phase epitaxy (VPE) process, a CVD process such as ultra-high vacuum chemical vapor deposition (UHV-CVD), a molecular beam epitaxy process, or a combination thereof. In the epitaxial growth process, a liquid or gaseous precursor may be used as a precursor for forming the first source/drain region 142.

The first source/drain regions 142 may be formed to have various shapes by controlling growth conditions in the epitaxial growth process. For example, the first source/drain region 142 may be formed to include the first sidewall 142S1 (refer to FIG. 3) and the second sidewall 142S2 (refer to FIG. 3). The first sidewall 142S1 may include the first portion 142A1 (refer to FIG. 3) which is a portion of the first sidewall 142S1 extending obliquely at the inclination angle θ1 with respect to the third direction (Z direction) and the second portion 142A2 (refer to FIG. 3) which is a portion of the first sidewall 142S1 extending obliquely at the second inclination angle θ2 with respect to the third direction, and the second sidewall 142S2 may include the first portion 142B1 (refer to FIG. 3) which is a portion of the second sidewall 142S2 extending obliquely at the first inclination angle θ1' and the second portion 142B2 (refer to FIG. 3) which is a portion of the second sidewall 142S2 extending obliquely at the second inclination angle θ2'. However, the shape of the first source/drain region 142 is not limited thereto, and may vary depending on a material of the first fin active region FA1, a material of the first source/drain region 142, types of transistors on the substrate 110, conditions of the epitaxial growth process, or the like.

In example embodiments, the first source/drain region 142 may include the bottom semiconductor layer 142L, a top semiconductor layer (not shown), and a capping semiconductor layer (not shown), which sequentially fill the inside of the recess region R1. As an example, the bottom semiconductor layer 142L, the top semiconductor layer, and the capping semiconductor layer may each include SiGe, while individual amounts of Si and Ge are different. As another example, the bottom semiconductor layer 144L, the top semiconductor layer, and the capping semiconductor layer may each include SiC, while individual amounts of Si and C are different.

In the process of forming the first source/drain region 142, a top surface of the second fin active region FA2 may be completely covered by the insulating spacer layer 154, and accordingly, a semiconductor layer may not be formed on the second fin active region FA2.

Figure 12:
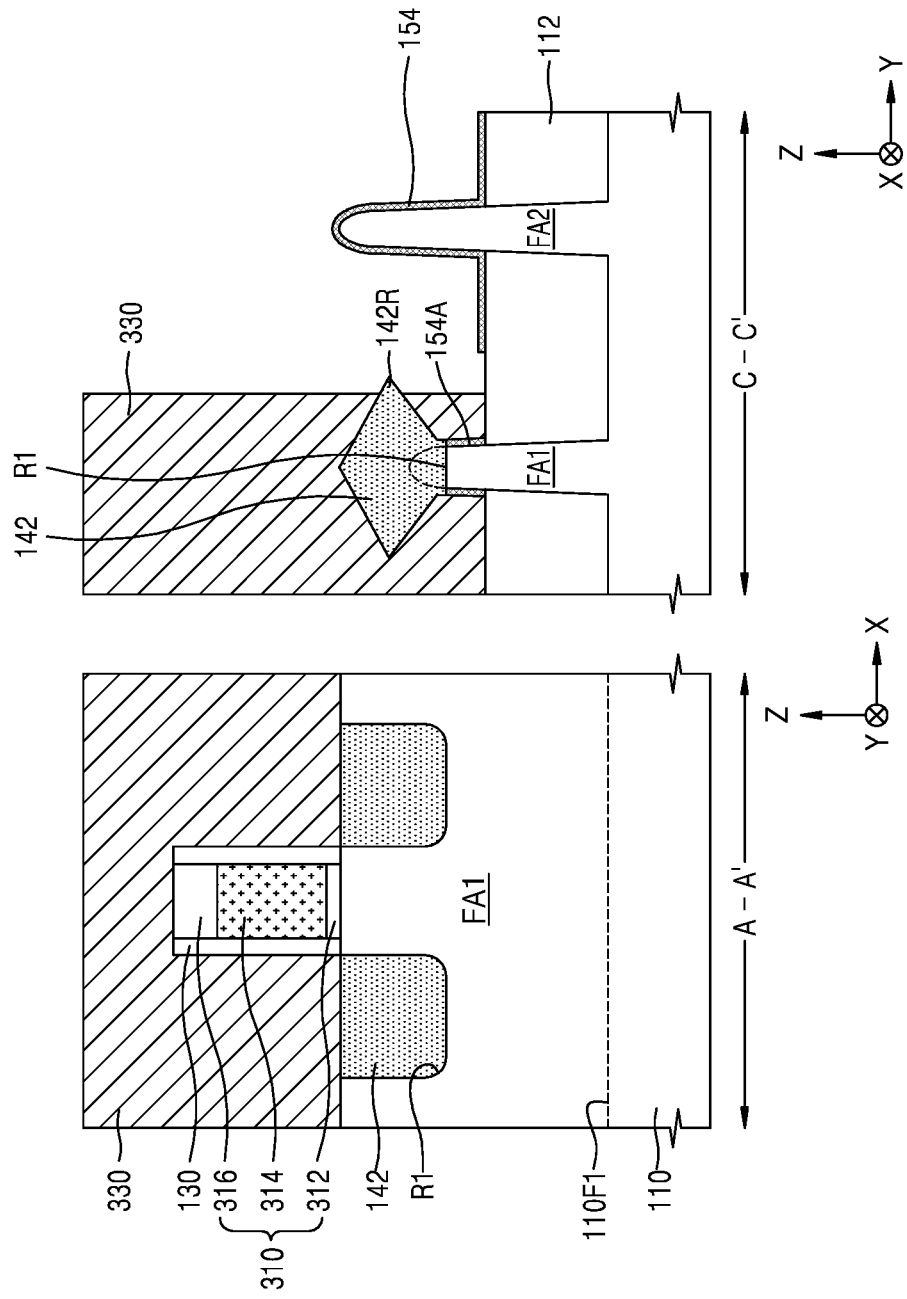

Referring to FIG. 12, a second mask layer 330 may be formed to cover the first fin active region FA1. The second mask layer 330 may be formed by using, for example, an SOH material or an SOD material. The second mask layer 330 may be a photo mask pattern or a photo mask layer.

In example embodiments, the second mask layer 330 may be arranged to expose a portion of the sidewall of the first source/drain region 142 formed on the first fin active region FA1. Here, the exposed portion of the sidewall of the first source/drain region 142 may be referred to as an exposed sidewall region 142R. For example, an area of the exposed sidewall region 142R may be adjustable by using the second mask layer 330 so that a distance between the first source/drain region 142 and the second source/drain region 144 may be controlled. Thus, an occurrence of an electric short between the first source/drain region 142 and the second source/drain region 144 may be prevented. For example, the second mask layer 330 may be arranged so as not to completely cover the first source/drain region 142 and thus, so as not to overlap the insulating spacer layer 154. Accordingly, a portion of the top surface of the isolation layer 112 may not be covered by the second mask layer 330 or the insulating spacer layer 154, and may be exposed to the outside of the second mask layer 330 or the insulating spacer layer 154.

For example, a width in the second direction (Y direction) of the exposed sidewall region 142R of the first source/drain region 142, which is not covered by the second mask layer 330, may vary depending on a width in the second direction (Y direction) of the first source/drain region 142. For example, when the first source/drain region 142 is overgrown, the width of the exposed sidewall region 142R in the second direction may be relatively large.

Figure 13:
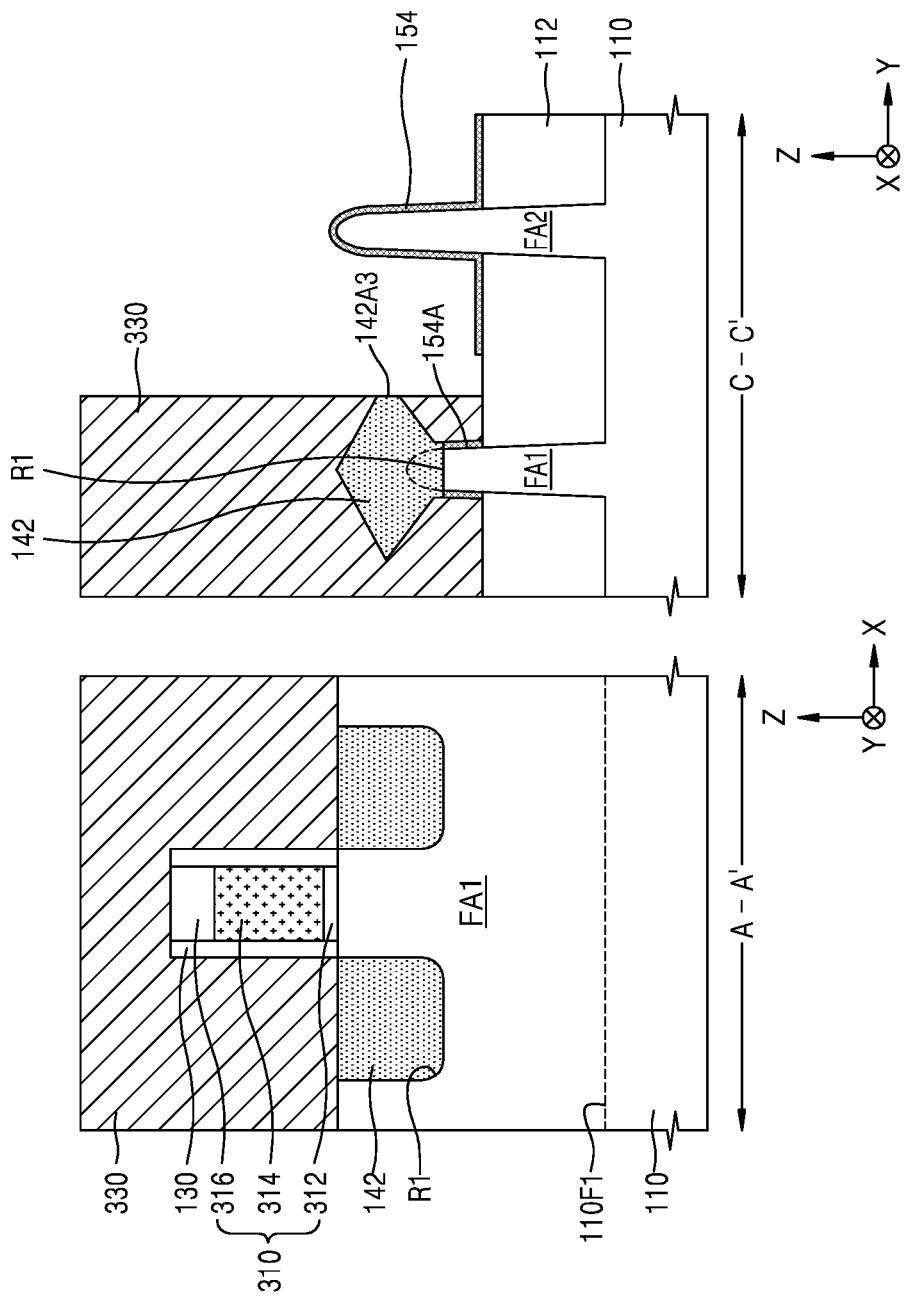

Referring to FIG. 13, the exposed sidewall region 142R of the first source/drain region 142, which is not covered by the second mask layer 330, may be removed by a trimming process (e.g., an etching process).

In example embodiments, the first source/drain region 142 may have a sidewall region extending in a vertical direction (Z direction) as the exposed sidewall region 142R is removed by the trimming process. The sidewall region extending in the vertical direction may be referred to as a third portion 142A3. Thus, a distance in the second direction (Y direction) between the first source/drain region 142 and the second fin active region FA2 may be further increased by the trimming process.

In general, it may be relatively difficult to precisely control the size of the source/drain regions grown by the epitaxial growth process and accordingly, some source/drain regions may overgrow and sizes (widths and heights) thereof may be relatively large. On the other hand, as the downscaling of the integrated circuit device progresses, a distance between adjacent source/drain regions may be also reduced, so that some overgrown source/drain regions are located very close to other source/drain regions adjacent thereto. When a portion of the some overgrown source/drain regions is not completely covered by a mask layer (for example, when a size of the some source/drain regions is too large or when misalignment of the mask layer occurs), a portion of the sidewall of the source/drain region may be exposed as illustrated in FIG. 12 and a parasitic semiconductor layer may be undesirably formed on an exposed surface of the some overgrown source/drain regions in the epitaxial growth process of other source/drain regions adjacent thereto, and accordingly, there may be a problem that the electrical short between the source/drain regions occurs.

According to example embodiments, the distance in the second direction (Y direction) between the first source/drain region 142 and the second fin active region FA2 may be further increased by the trimming process, and accordingly, a process margin may increase. Thus, an undesired exposure of the first source/drain region 142 to the outside of a mask (e.g. the third mask layer 340 (refer to FIG. 15)) and an undesired growth or formation of the parasitic semiconductor layer thereby may be prevented.

Thereafter, the second mask layer 330 may be removed. For example, the second mask layer 330 may be removed by an etching process. The etching process may include wet etching, dry etching, or combination thereof.

Figure 14:
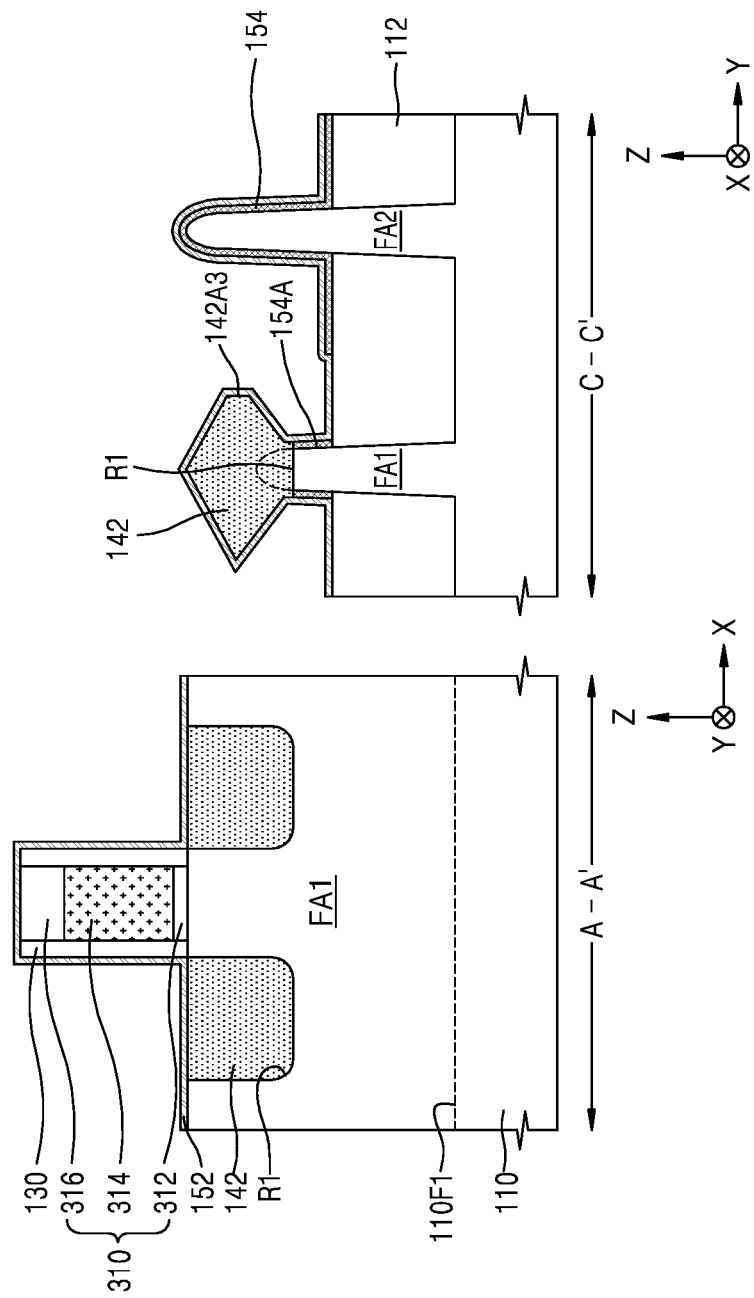

Referring to FIG. 14, a first insulating liner 152 may be formed on the sacrificial gate structure 310, the isolation layer 112, the first source/drain region 142, and the insulating spacer layer 154.

The first insulating liner 152 may be formed, for example, by an ALD process or a CVD process by using silicon nitride, silicon oxynitride, silicon oxide carbonitride, silicon oxide, or a combination thereof. Even though the first insulating liner 152 is shown as a single layer in FIG. 14, the first insulating liner 152 may have a stacked structure of a plurality of insulating layers.

The first insulating liner 152 may be conformally formed on a whole surface of the first source/drain region 142 and extend in the vertical direction (Z direction) on the third portion 142A3.

Figure 15:
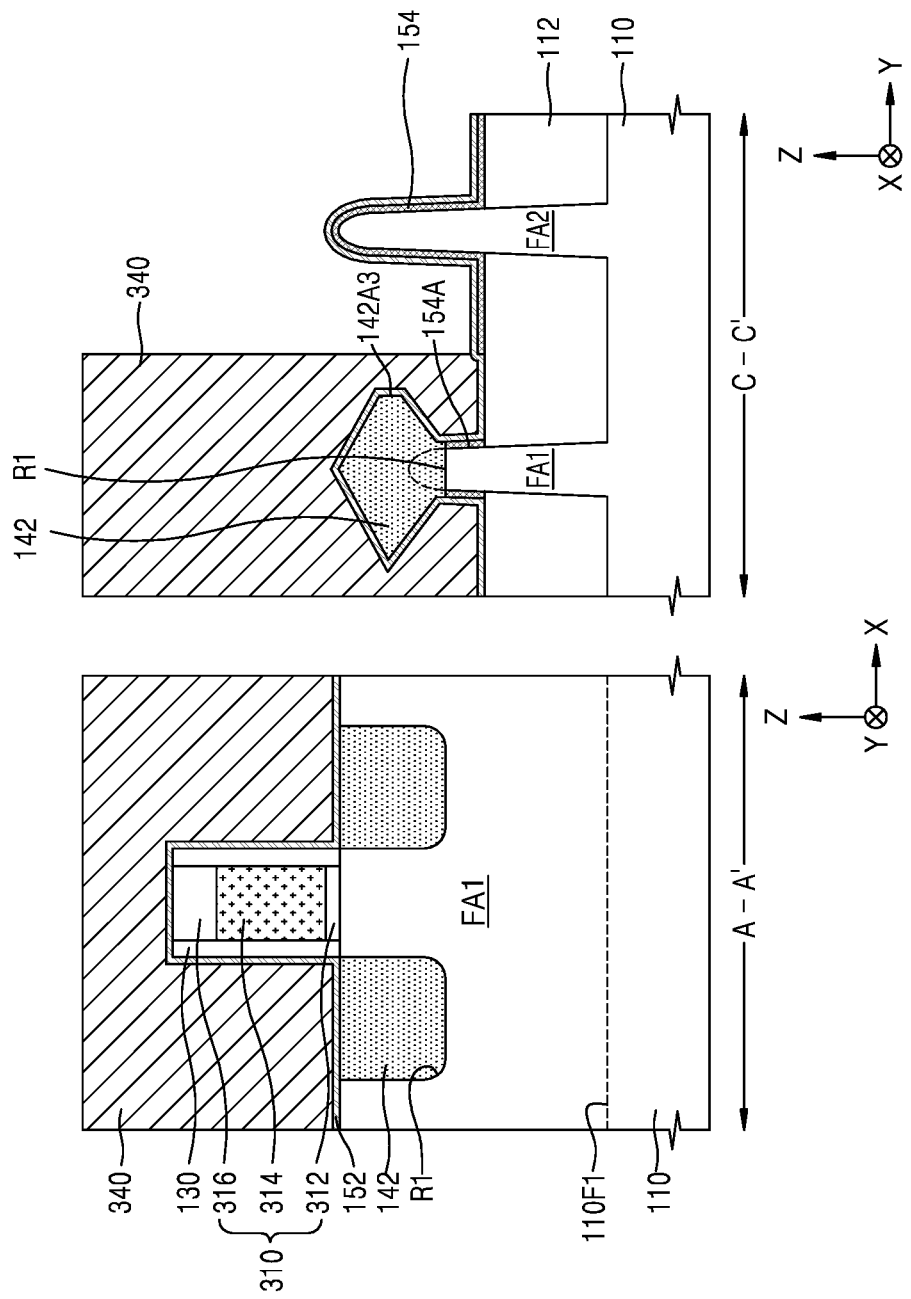

Referring to FIG. 15, a third mask layer 340 may be formed to cover the first fin active region FA1 and the first source/drain region 142. The third mask layer 340 may be formed by using, for example, an SOH material or an SOD material. The third mask layer 340 may be a photo mask pattern or a photo mask layer.

The third mask layer 340 may be arranged to expose portions of the second fin active region FA2, and the insulating spacer layer 154 and the first insulating liner 152 which are sequentially formed on the second fin active region FA2. On the other hand, the third mask layer 340 may be arranged to cover a whole top surface of the first source/drain region 142.

Figure 16:
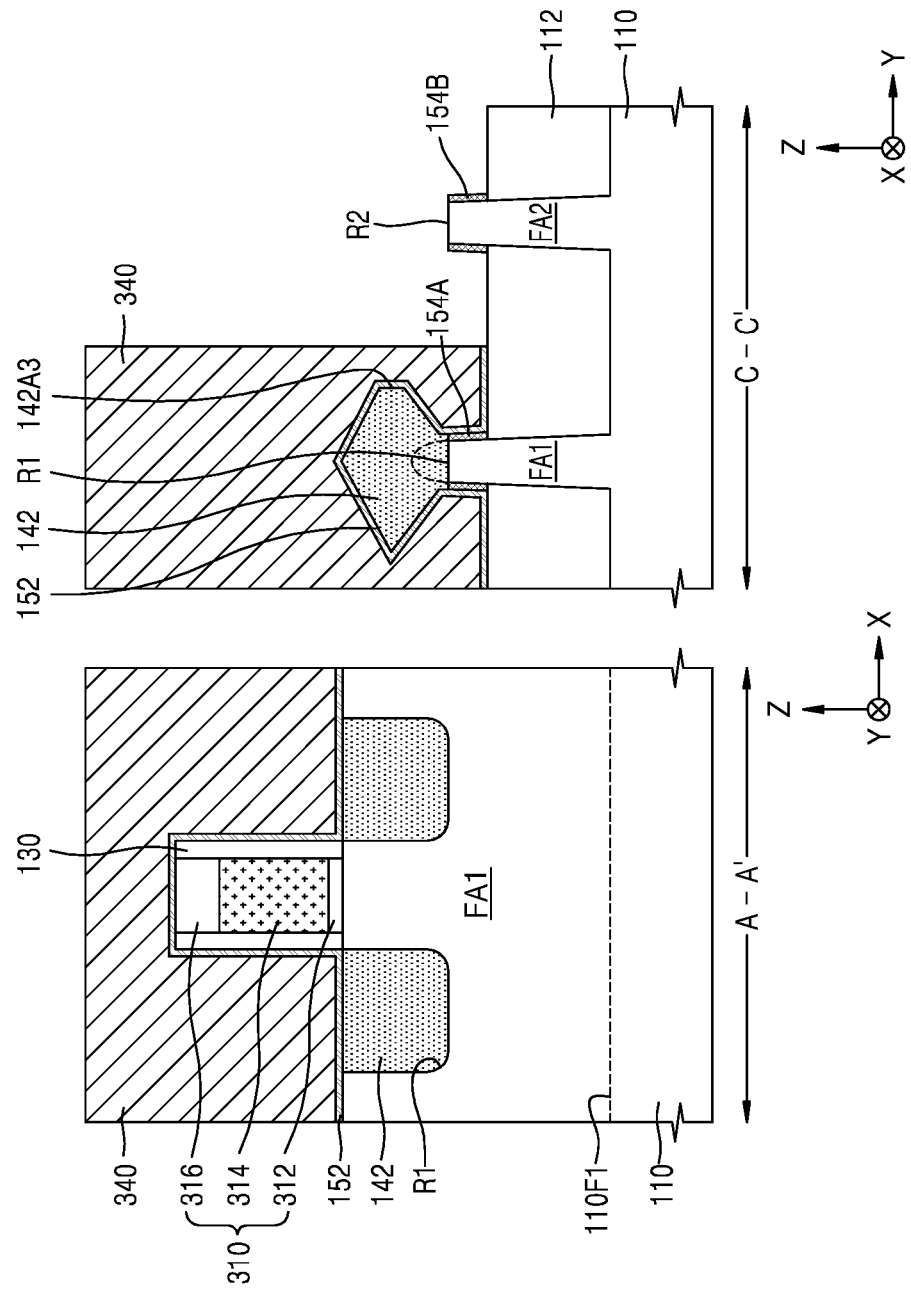

Referring to FIG. 16, the recess region R2 may be formed by etching a portion of the second fin active region FA2. The top surfaces of the insulating spacer layer 154 and the first insulating liner 152 which have been formed on the second fin active region FA2 may be removed together with the etching portion of the second fin active region FA2, and the insulating spacers 154B may remain on both sidewalls of the second fin active region FA2 on the isolation layer 112. For example, the insulating spacer 154B may remain on the sidewalls of the second fin active region FA2 by performing an anisotropic etching process on the first insulating liner 152 and insulating spacer layer 154. The first insulating liner 152 arranged on the sidewalls and the top surface of the sacrificial gate structure 310 which is not covered by the third mask layer 340 may also be removed together in the etching process.

Thereafter, the third mask layer 340 may be removed. For example, the third mask layer 340 may be removed by an etching process. The etching process may include wet etching, dry etching, or combination thereof.

Figure 17:
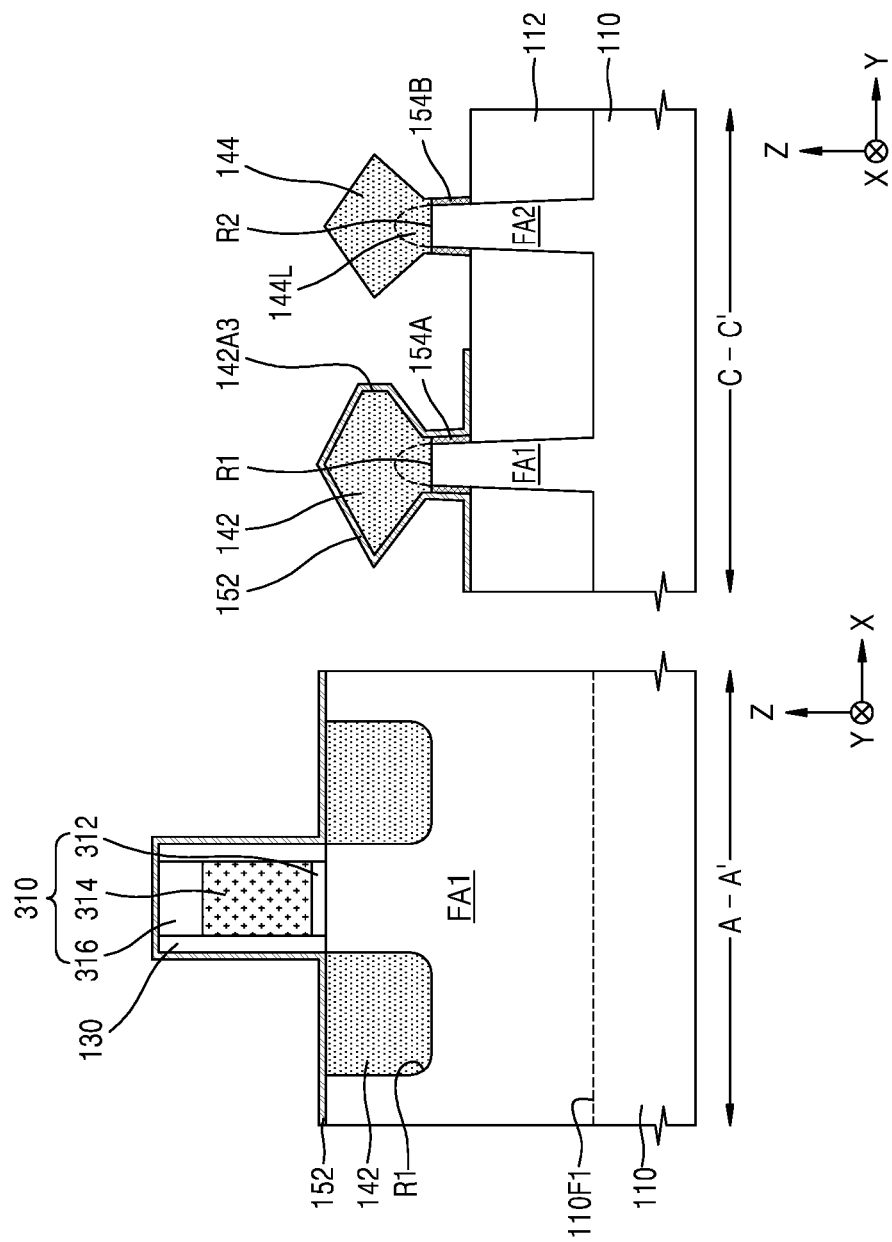

Referring to FIG. 17, a second source/drain region 144 may be formed in the inside of the recess region R2.

In example embodiments, the second source/drain region 144 may be formed by an epitaxial growth process by using, as seed layers, the sidewalls of the second fin active region FA2 and the top surface of the substrate 110 which are exposed to an inner-wall of the recess region R2. The epitaxial growth process may be a VPE process, a CVD process such as UHV-CVD, a molecular beam epitaxy process, or a combination thereof. In the epitaxial growth process, a liquid or gaseous precursor may be used as a precursor for forming the second source/drain region 144.

The second source/drain regions 144 may be formed to have various shapes by controlling growth conditions in the epitaxial growth process. For example, the second source/drain region 144 may be formed in a shape having sidewalls which extend obliquely at an inclination angle. However, the shape of the second source/drain region 144 is not limited thereto, and may vary depending on a material of the second fin active region FA2, a material of the second source/drain region 144, types of transistors on the substrate 110, conditions of the epitaxial growth process, or the like.

In example embodiments, the second source/drain region 144 may include a bottom semiconductor layer 144L, a top semiconductor layer (not shown), and a capping semiconductor layer (not shown), which sequentially fill the inside of the recess region R2. As an example, the bottom semiconductor layer 144L, the top semiconductor layer, and the capping semiconductor layer may each include SiGe, while individual amounts of Si and Ge are different. As another example, the bottom semiconductor layer 144L, the top semiconductor layer, and the capping semiconductor layer may each include SiC, while individual amounts of Si and C are different.

In the process of forming the second source/drain region 144, the top surface of the first fin active region FA1 may be completely covered by the first insulating liner 152 and accordingly, a semiconductor layer may not be formed on the first fin active region FA1 and the first source/drain region 142.

Figure 18:
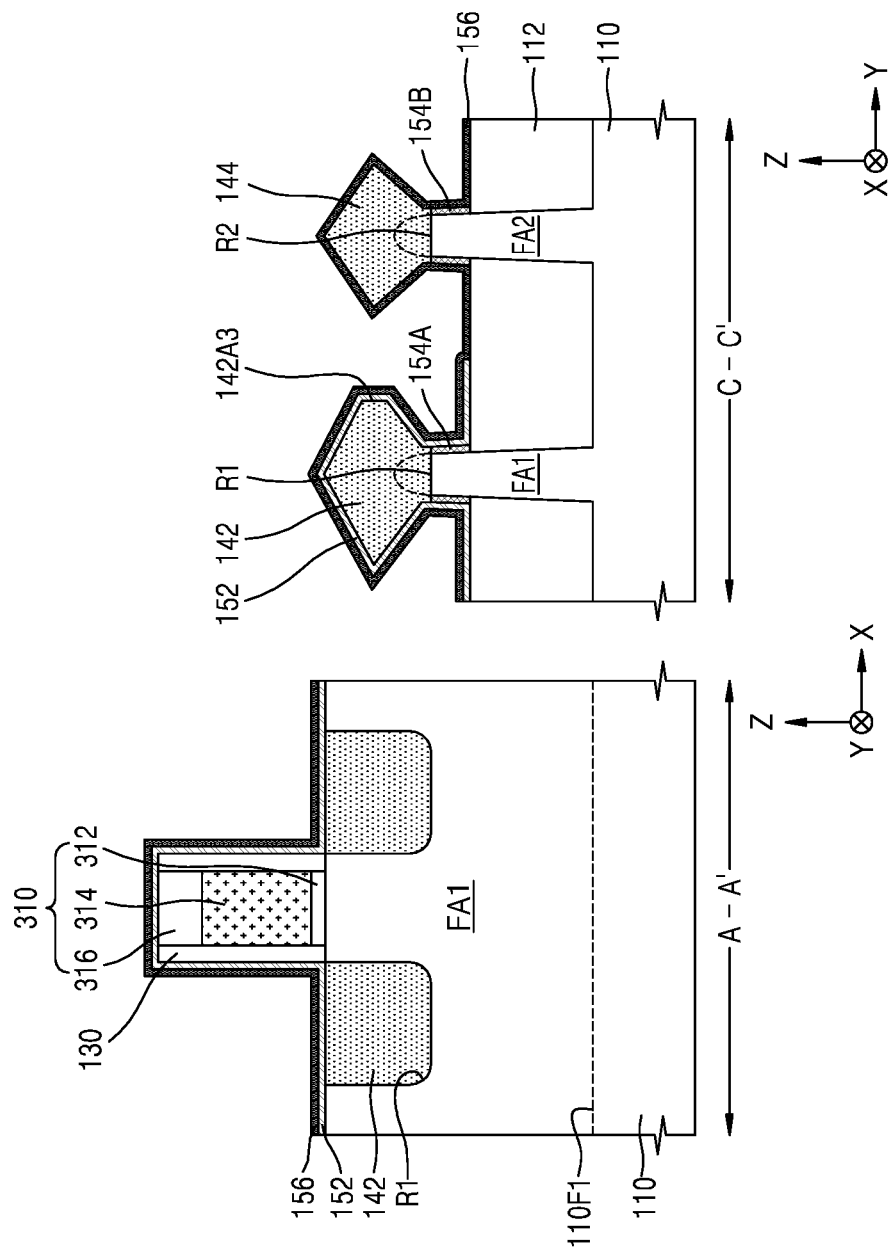

Referring to FIG. 18, the second insulating liner 156 may be formed to cover both the first source/drain region 142 and the second source/drain region 144. The second insulating liner 156 may be formed, for example, by an ALD process or a CVD process by using silicon nitride, silicon oxynitride, silicon oxide carbonitride, silicon oxide, or a combination thereof. Even though the second insulating liner 156 is shown as a single layer in FIG. 18, the second insulating liner 156 may have a stacked structure of a plurality of insulating layers.

Figure 19:
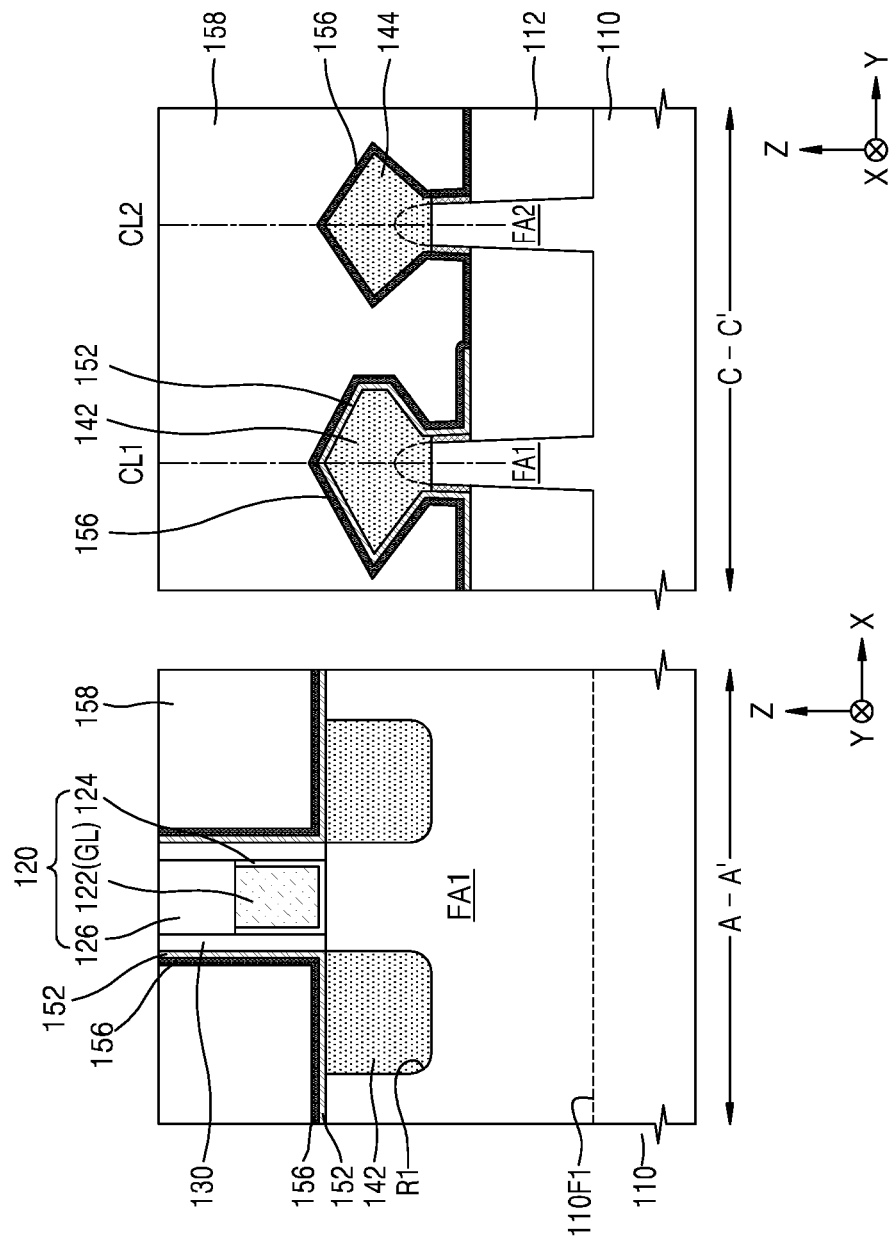

Referring to FIG. 19, an insulating layer (not shown) covering the second insulating liner 156 (refer to FIG. 18) may be formed on the substrate 110, and then, the inter-gate insulating layer 158 may be formed by planarizing the insulating layer (not shown) so that a top surface of each of the hard mask pattern 316 and the gate spacer 130 is exposed.

Thereafter, the sacrificial gate structure 310 (refer to FIG. 18) may be removed to form a gate space (not shown) defined between the sidewalls of the gate spacer 130 and the gate insulating layer 124 may be formed on an inner-wall of the gate space (not shown). Thereafter, a conductive layer (not shown) filling the inside of the gate space (not shown) may be formed on the gate insulating layer 124 and then, the gate electrode 122 may be formed by etching back a top surface of the conductive layer (not shown). Thereafter, an insulating layer (not shown) filling a remaining portion of the gate space (not shown) may be formed on the gate electrode 122 and then, the gate capping layer 126 filling the gate space (not shown) may be formed by removing a top surface of the insulating layer (not shown) so that a top surface of the inter-gate insulating layer 158 or the gate spacer 130 is exposed.

In example embodiments, a removal process of the sacrificial gate structure 310 may include a wet etching process. An etchant, for example, $HNO_3$, diluted hydrofluoric acid (DHF), $NH_4OH$, tetramethyl ammonium hydroxide (TMAH), potassium hydroxide (KOH), or a combination thereof may be used to perform the wet etching process.

Figure 20:
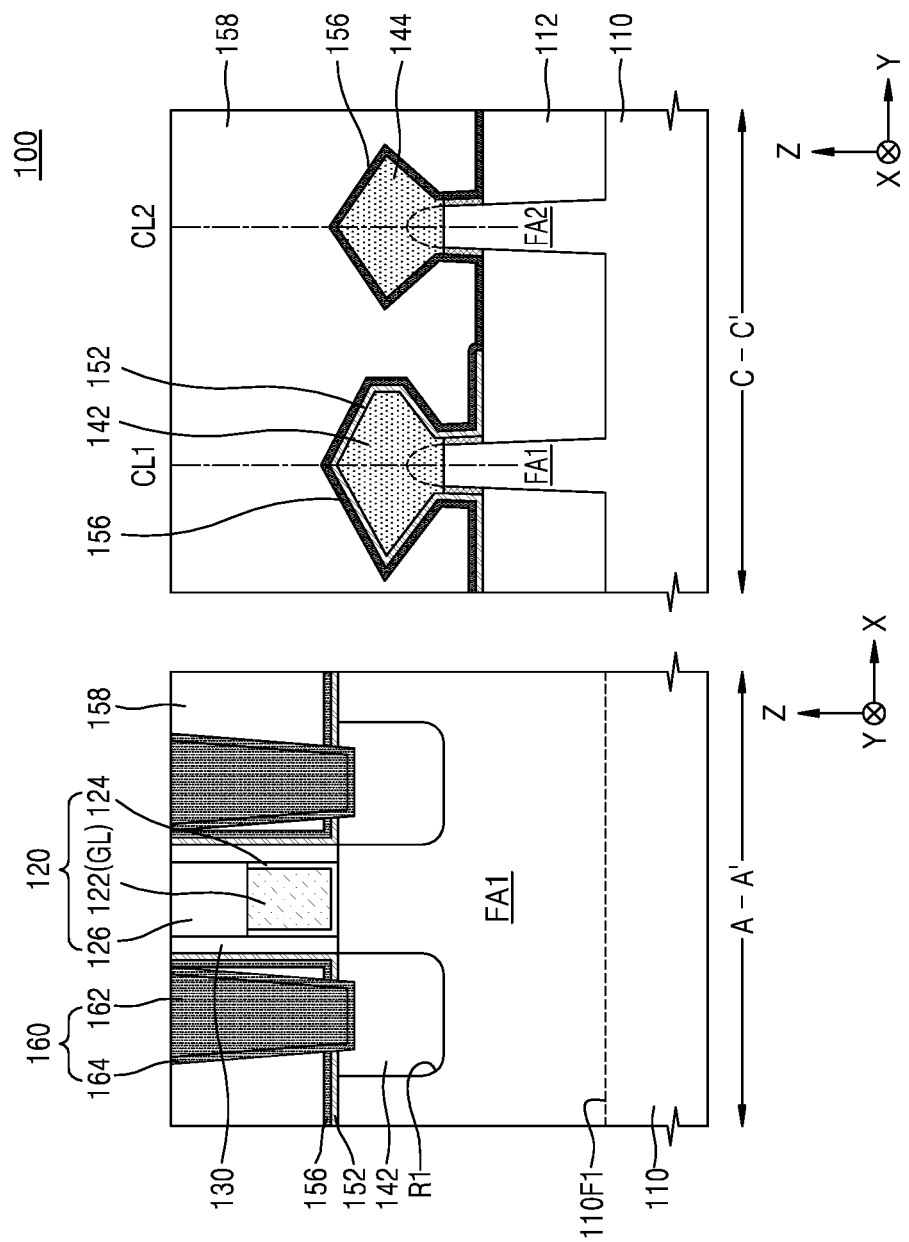

Referring to FIG. 20, a contact hole (not shown) exposing the top surfaces of the first source/drain region 142 and the second source/drain region 144 may be formed by removing a portion of the inter-gate insulating layer 158 and portions of first and second insulating liners 152 and 156, and the conductive barrier layer 164 may be formed on an inner-wall of the contact hole (not shown) by using Ti, Ta, TiN, TaN, or a combination thereof. Thereafter, the contact plug 162 filling the contact hole (not shown) may be formed on the conductive barrier layer 164. In example embodiments, the contact plug 162 may include one of W, Co, Ni, Ru, Cu, Al, silicides thereof, or an alloy thereof.

The integrated circuit device 100 may be completed by performing the above-described processes.

The above integrated circuit device may be applied to various types of memory devices including the source/drain structures disclosed herein. For example, the integrated circuit device may be applied to source/drain structures of logic devices such as central processing units (CPUs), main processing units (MPUs), or application processors (APs), or the like. Additionally, the integrated circuit device may be applied to source/drain structures of volatile memory devices such as DRAM devices or SRAM devices, or source/drain structures of non-volatile memory devices such as flash memory devices, PRAM devices, MRAM devices, RRAM devices, or the like.

According to the above-described method of manufacturing the integrated circuit device 100, after the first source/drain region 142 is grown, the exposed sidewall region 142R which is not covered by the second mask layer 330 may be removed by a trimming process. Thus, the first source/drain region 142 may be completely covered by the third mask layer 340 in a subsequent epitaxial growth process of the second source/drain region 144 and the parasitic semiconductor layer may not be formed in a portion of the first source/drain region 142 in the epitaxial growth process of the second source/drain region 144. Thus, the occurrence of an electrical short between the first source/drain region 142 and the second source/drain region 144 may be prevented.

As described above, example embodiments have been disclosed in the drawings and specification. While the embodiments have been described herein with reference to specific terms, it should be understood that they have been used only for the purpose of describing the technical idea of the inventive concept and not for limiting the scope of the inventive concept as defined in the claims. Therefore, it will be clearly understood by one of ordinary skill in the art that various modifications and equivalent embodiments are possible without departing from the scope of the inventive concept. Accordingly, the true scope of protection of the inventive concept should be determined by the technical idea of the following claims.

What is claimed is:
1. An integrated circuit device comprising:
a first fin active region protruding from a substrate and extending in a first direction parallel to a top surface of the substrate;
a second fin active region protruding from the substrate, the second fin active region extending in the first direction and spaced apart from the first fin active region in a second direction different from the first direction;
a gate line intersecting the first and second fin active regions on the substrate and extending in the second direction;
a first source/drain region on one side of the gate line in the first fin active region; and
a second source/drain region on one side of the gate line in the second fin active region and facing the first source/drain region,
wherein, with respect to a cross-section perpendicular to the first direction, the first source/drain region has an asymmetrical shape with respect to a centerline of the first source/drain region extending in a third direction perpendicular to the top surface of the substrate and extending through a center point, with respect to the second direction, of a top surface of the first source/drain region, and wherein the first source/drain region comprises a first sidewall including a first portion and the first portion extends substantially perpendicular to the top surface of the substrate.

2. The integrated circuit device of claim 1, wherein the first source/drain region further comprises a second sidewall opposite to the first sidewall, and
wherein the first sidewall faces the second source/drain region.

3. The integrated circuit device of claim 2, wherein the first sidewall of the first source/drain region comprises:
a second portion extending obliquely at a first inclination angle with respect to the third direction from an uppermost surface of the first source/drain region; and
a third portion extending obliquely at a second inclination angle with respect to the third direction from a bottom surface of the first source/drain region, and
wherein the first portion of the first sidewall is disposed between the second portion and the third portion and extends substantially parallel to the third direction.

4. The integrated circuit device of claim 2, wherein the second sidewall of the first source/drain region comprises:
a first portion extending obliquely at a first inclination angle with respect to the third direction from an uppermost surface of the first source/drain region; and
a second portion extending obliquely at a second inclination angle with respect to the third direction from a bottom surface of the first source/drain region,
wherein the first portion of the second sidewall and the second portion of the second sidewall meet each other.

5. The integrated circuit device of claim 2, wherein a first maximum distance in the second direction from the centerline of the first source/drain region to the first sidewall of the first source/drain region is less than a second maximum distance in the second direction from the centerline of the first source/drain region to the second sidewall of the first source/drain region.

6. The integrated circuit device of claim 2, further comprising:
a first insulating liner conformally covering the first source/drain region; and
a second insulating liner conformally covering the second source/drain region,
wherein the first insulating liner extends in the third direction on a portion of the first sidewall.

7. The integrated circuit device of claim 6, wherein the first insulating liner extends onto an isolation layer between the first source/drain region and the second source/drain region, and a first maximum distance in the second direction from the centerline of the first source/drain region to the first sidewall of the first source/drain region is less than a second maximum distance from the centerline of the first source/drain region to an edge of the first insulating liner between the first source/drain region and the second source/drain region.

8. The integrated circuit device of claim 2, wherein the first portion of the first sidewall is formed by an epitaxial growth process and a trimming process using a photo mask pattern.

9. The integrated circuit device of claim 1, wherein the first fin active region is either an active region of a p-type metal oxide semiconductor (PMOS) transistor or an active region of an n-type metal oxide semiconductor (NMOS) transistor, and
wherein the second fin active region is either an active region of the NMOS transistor or an active region of the PMOS transistor.

10. An integrated circuit device comprising:
a first fin active region protruding from a substrate and extending in a first direction parallel to a top surface of the substrate;
a second fin active region protruding from the substrate, the second fin active region extending in the first direction and spaced apart from the first fin active region in a second direction different from the first direction;
a gate line intersecting the first and second fin active regions on the substrate and extending in the second direction;
a first source/drain region on one side of the gate line in the first fin active region; and
a second source/drain region on one side of the gate line in the second fin active region and facing the first source/drain region,
wherein the first source/drain region comprises a first sidewall facing the second source/drain region and a second sidewall opposite to the first sidewall, and the first sidewall of the first source/drain region has a profile different from the second sidewall with respect to a centerline of the first source/drain region extending in a third direction perpendicular to the top surface of the substrate and extending through a center point, with respect to the second direction, of a top surface of the first source/drain region, and
wherein the first sidewall of the first source/drain region comprises a first portion extending substantially perpendicular to the top surface of the substrate.

11. The integrated circuit device of claim 10, wherein the first sidewall of the first source/drain region further comprises:
a second portion extending obliquely at a first inclination angle with respect to the third direction from an uppermost surface of the first source/drain region; and
a third portion extending obliquely at a second inclination angle with respect to the third direction from a bottom surface of the first source/drain region, and
wherein the first portion of the first sidewall is disposed between the second portion and the third portion and extends substantially parallel to the third direction.

12. The integrated circuit device of claim 10, wherein the second sidewall of the first source/drain region comprises:
a first portion extending obliquely at a first inclination angle with respect to the third direction from an uppermost surface of the first source/drain region; and
a second portion extending obliquely at a second inclination angle with respect to the third direction from a bottom surface of the first source/drain region,
wherein the first portion of the second sidewall and the second portion of the second sidewall meet each other.

13. The integrated circuit device of claim 10, wherein a first maximum distance in the second direction from the centerline of the first source/drain region to the first sidewall of the first source/drain region is less than a second maximum distance in the second direction from the centerline of the first source/drain region to the second sidewall of the first source/drain region.

14. The integrated circuit device of claim 10, further comprising:
a first insulating liner conformally covering the first source/drain region and a portion of the first insulating liner extending in the third direction; and
a second insulating liner conformally covering the second source/drain region and extending onto a top surface of the first insulating liner.

15. The integrated circuit device of claim 10, wherein the first portion of the first sidewall is formed by an epitaxial growth process and a trimming process using a photo mask pattern.

16. An integrated circuit device comprising:
a first fin active region protruding from a substrate and extending in a first direction parallel to a top surface of the substrate;
a second fin active region protruding from the substrate, the second fin active region extending in the first direction and spaced apart from the first fin active region in a second direction different from the first direction;
a gate line intersecting the first and second fin active regions on the substrate and extending in the second direction;
a first source/drain region on one side of the gate line in the first fin active region;
a second source/drain region on one side of the gate line in the second fin active region and facing the first source/drain region,
wherein, with respect to a cross-section perpendicular to the first direction, at least one of the first and second source/drain regions has an asymmetrical shape with respect to a respective centerline of the first and second source/drain regions extending in a third direction perpendicular to the top surface of the substrate and extending through a respective center point, with respect to the second direction, of a top surface of the first and second source/drain regions, and
wherein the at least one of the first and second source/drain regions comprises a first sidewall facing the second source/drain region or the first source/drain region and a second sidewall opposite to the first sidewall, and a portion of the first sidewall extends substantially perpendicular to the top surface of the substrate.

17. The integrated circuit device of claim 16, wherein the first sidewall has a different profile from the second sidewall with respect to the respective centerline.

18. The integrated circuit device of claim 17, wherein a first maximum distance in the second direction from the respective centerline of the at least one of the first and second source/drain regions to the first sidewall is less than a second maximum distance in the second direction from the respective centerline to the second sidewall.

19. The integrated circuit device of claim 16, wherein the asymmetrical shape of the cross-section of the at least one of the first and second source/drain regions is formed by an epitaxial growth process and a trimming process using a mask pattern.

20. The integrated circuit device of claim 16, wherein when the at least one of the first and second source/drain regions is the first source/drain region, a cross-section of the second source/drain region perpendicular to the first direction has a symmetrical shape with respect to a centerline of the second source/drain region in the second direction extending in the third direction.

* * * * *